(12) United States Patent
Caveney

(10) Patent No.: US 9,186,799 B2
(45) Date of Patent: Nov. 17, 2015

(54) COMPACT DIRECT DRIVE SPINDLE

(75) Inventor: Robert T. Caveney, Windham, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 658 days.

(21) Appl. No.: 13/547,786

(22) Filed: Jul. 12, 2012

(65) Prior Publication Data

US 2013/0014605 A1 Jan. 17, 2013

Related U.S. Application Data

(60) Provisional application No. 61/510,819, filed on Jul. 22, 2011, provisional application No. 61/507,276, filed on Jul. 13, 2011.

(51) Int. Cl.
| | | |
|---|---|---|
| *B25J 9/18* | (2006.01) | |
| *B25J 17/00* | (2006.01) | |
| *B25J 18/04* | (2006.01) | |
| *H01L 21/677* | (2006.01) | |
| *B25J 9/12* | (2006.01) | |

(52) U.S. Cl.
CPC *B25J 18/04* (2013.01); *B25J 9/126* (2013.01); *H01L 21/67742* (2013.01); *Y10T 74/20317* (2015.01)

(58) Field of Classification Search
CPC ............ B25J 9/042; B25J 18/04; B25J 9/126; H01L 21/67742; Y10T 74/20317
USPC ................. 318/568.11; 901/23, 27; 74/490.03
See application file for complete search history.

(56) References Cited

U.S. PATENT DOCUMENTS

| | | |
|---|---|---|
| 4,600,355 A | 7/1986 | Johnson |
| 4,645,409 A | 2/1987 | Gorman |
| 4,780,047 A | 10/1988 | Holt et al. |
| 4,787,813 A | 11/1988 | Stevens et al. |
| 4,874,998 A | 10/1989 | Hollis, Jr. |
| 5,024,116 A | 6/1991 | Kraft |
| 5,741,113 A | 4/1998 | Bacchi et al. |

(Continued)

FOREIGN PATENT DOCUMENTS

| | | |
|---|---|---|
| CN | 101461051 | 6/2009 |
| DE | 3150511 | 6/1983 |

(Continued)

OTHER PUBLICATIONS

International Search Report Date Oct. 10, 2013.

*Primary Examiner* — Bentsu Ro
*Assistant Examiner* — Zemenay Truneh
(74) *Attorney, Agent, or Firm* — Perman & Green, LLP; Colin C. Durham

(57) ABSTRACT

A substrate transport apparatus including a frame, at least one arm link rotatably connected to the frame and a shaftless drive section. The shaftless drive section including stacked drive motors for rotating the at least one arm link relative to the frame through a shaftless interface, each of the stacked drive motors including a stator having stator coils disposed on a fixed post fixed relative to the frame and a rotor substantially peripherally surrounding the stator such that the rotor is connected to a respective one of the at least one arm link for rotating the one of the at least one arm link relative to the frame causing an extension or retraction of the one of the at least one arm link, where the stacked drive motors are disposed in the at least one arm link so that part of each stator is within a common arm link.

17 Claims, 15 Drawing Sheets

(56) References Cited

U.S. PATENT DOCUMENTS

| | | | |
|---|---|---|---|
| 5,955,858 A * | 9/1999 | Kroeker et al. | 318/568.11 |
| 6,084,373 A | 7/2000 | Goldenberg et al. | |
| 6,109,860 A | 8/2000 | Ogawa et al. | |
| 6,189,404 B1 | 2/2001 | Hatake et al. | |
| 6,458,250 B1 | 10/2002 | Holliday et al. | |
| 6,601,468 B2 | 8/2003 | Grover et al. | |
| 6,831,436 B2 | 12/2004 | Gonzalez | |
| 6,893,204 B1 | 5/2005 | Suzuki et al. | |
| 7,013,750 B1 | 3/2006 | Kazami | |
| 7,688,017 B2 * | 3/2010 | Hudgens | 318/568.11 |
| 2003/0035711 A1 | 2/2003 | Gilchrist | |
| 2003/0150219 A1 | 8/2003 | Watanabe et al. | |
| 2003/0223853 A1 | 12/2003 | Caveney et al. | |
| 2007/0280813 A1 * | 12/2007 | Nakamura et al. | 414/744.5 |
| 2008/0298944 A1 | 12/2008 | Hofmeister et al. | |
| 2009/0015248 A1 * | 1/2009 | Moura et al. | 324/207.26 |
| 2009/0243413 A1 * | 10/2009 | Gilchrist et al. | 310/90.5 |
| 2009/0290967 A1 | 11/2009 | Jamieson et al. | |

FOREIGN PATENT DOCUMENTS

| | | |
|---|---|---|
| DE | 19939646 | 3/2001 |
| JP | 1020249757 | 9/1998 |
| JP | 2000323554 | 11/2000 |
| WO | 9311914 | 6/1993 |
| WO | 2010051905 | 5/2010 |

* cited by examiner

COMPACT DIRECT DRIVE SPINDLE

This application is a non-provisional of and claims the benefit of U.S. provisional patent application No. 61/510,819 filed on Jul. 22, 2011 and U.S. provisional patent application No. 61/507,276 filed on Jul. 13, 2011, the disclosure of which is incorporated herein by reference in its entirety.

BACKGROUND

1. Field

The exemplary embodiment generally relates to drives for robot systems, and more particularly, to spindle drives for robot systems.

2. Brief Description of Related Developments

Current vacuum robots either use a ferrofluidic or lip seal to isolate the motors and encoders from vacuum, or in the case of the Brooks MAGNATRAN® products, isolate the motor stators using a barrier wall but place the magnet rotor and encoders directly in the vacuum environment. In both of these cases, the motor is placed below the bellows and shafts are used to connect the motor to the robot arm links.

It would be advantageous to leverage an inverted drive design that places the stators on a stationary inner post and the rotor to the outside of the stators.

BRIEF DESCRIPTION OF THE DRAWINGS

The foregoing aspects and other features of the disclosed embodiments are explained in the following description, taken in connection with the accompanying drawings, wherein.

DETAILED DESCRIPTION OF THE EXEMPLARY EMBODIMENT(S)

Figure 1:
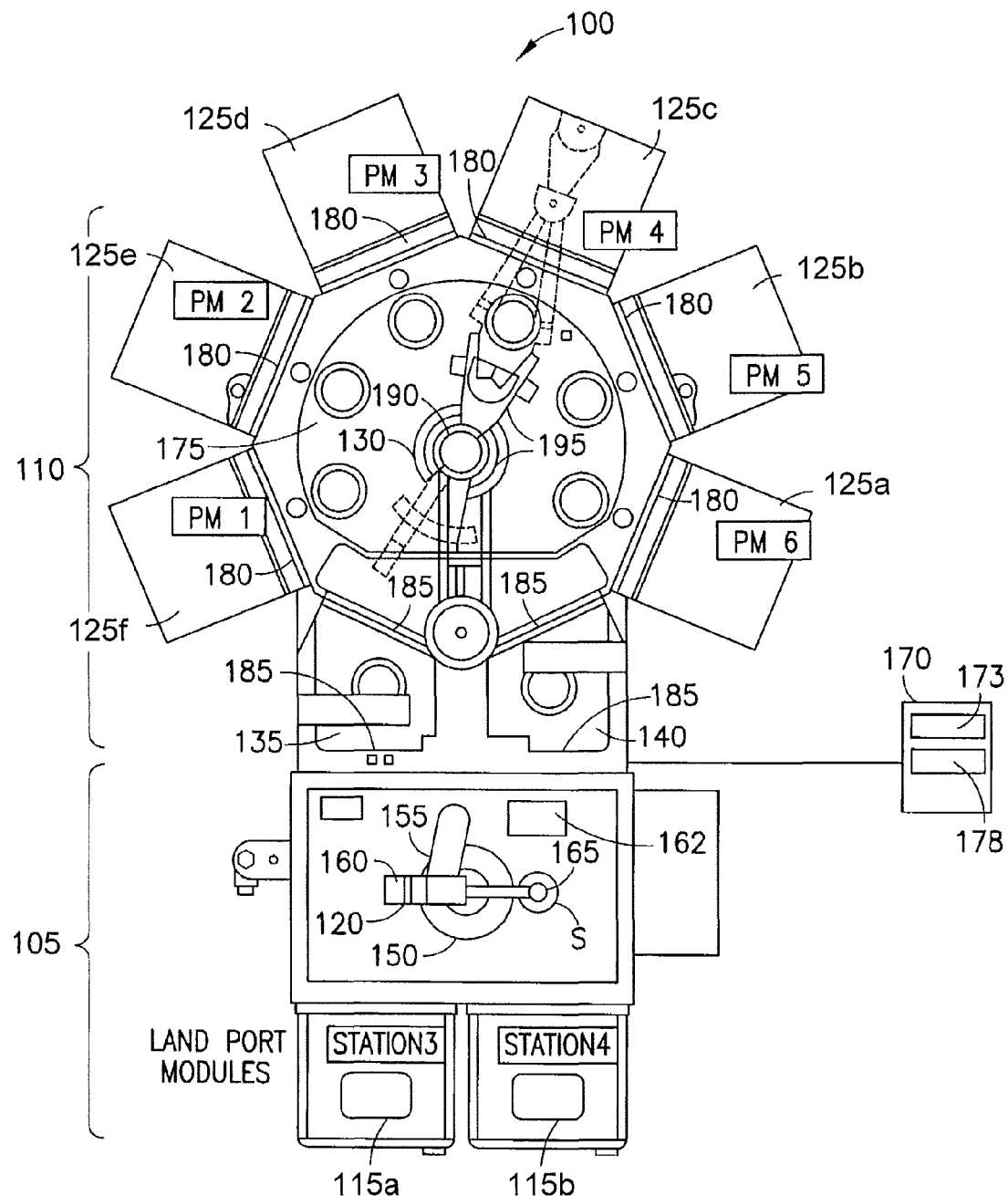
FIG. 1 is a schematic illustration of a portion of a substrate processing apparatus incorporating features in accordance with aspects of the disclosed embodiment.

FIG. 1 is a schematic illustration of a substrate processing apparatus incorporating features in accordance with aspects of the disclosed embodiment. Although the aspects of the disclosed embodiment will be described with reference to the drawings, it should be understood that the aspects of the disclosed embodiment can be embodied in many alternate forms. In addition, any suitable size, shape or type of elements or materials could be used. Further, although the aspects of the disclosed embodiment will be described in the context of a vacuum robot it should be noted that the aspects of the disclosed embodiment encompasses any situation where a drive motor may be used.

Figure 2:
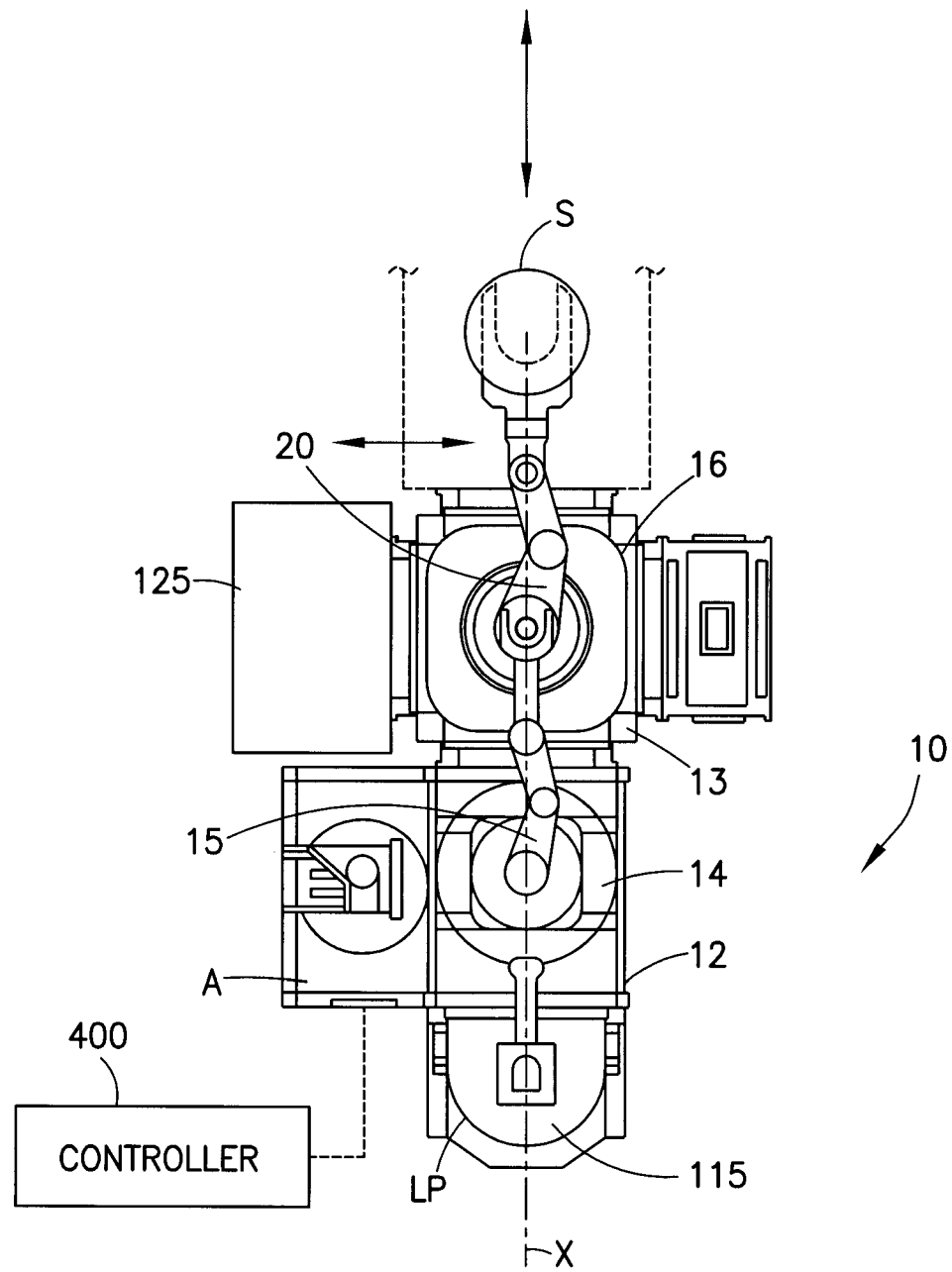
FIG. 2 is a schematic illustration of a portion of a substrate processing apparatus incorporating features in accordance with aspects of the disclosed embodiment.

The substrate processing apparatus 100 shown in FIG. 1 is a representative substrate processing tool incorporating features in accordance with aspects of the disclosed embodiment. In this example the processing apparatus 100 is shown as having a general batch processing tool configuration. In other aspects the tool may have any desired arrangement, for example the tool may be configured to perform single step processing of substrates or have a linear or Cartesian arrangement such as shown in FIG. 2. In still other aspects, the substrate processing apparatus may be of any desired type such as sorter, stocker, metrology tool, etc. The substrates S processed in the apparatus 100 may be any suitable substrates including, but not limited to, liquid crystal display panels, solar panels, semiconductor wafers, such as a 200 mm, 300 mm, 450 mm diameter wafers, or any other desired diameter substrate, any other type of substrate having any suitable shape, size and thickness suitable for processing by substrate processing apparatus 100, such as a blank substrate, or an article having characteristics similar to a substrate, such as certain dimensions or a particular mass.

In one aspect, the apparatus 100 may generally have a front section 105, for example forming a mini-environment and an adjoining atmospherically isolatable or sealed section 110 that can be sealed from an external environment for holding a controlled sealed atmosphere, which for example may be equipped to function as a vacuum chamber. In other aspects, the sealed atmosphere section may hold an inert gas (e.g. $N_2$) or any other environmentally sealed and/or controlled atmosphere.

The front section 105 may generally have, for example one or more substrate holding cassettes 115, 115a, 115b, and a front end robot 120. The front section 105 may also, for example, have other stations or sections such as an aligner 162 or buffer located therein. Section 110 may have one or more processing modules 125, 125a-125f, and a vacuum robot arm 130. The processing modules 125, 125a-125f may be of any type such as material deposition, etching, baking, polishing, ion implantation cleaning, etc. As may be realized the position of each module, with respect to a desired reference frame, such as the robot reference frame, may be registered with controller 170. Also, one or more of the modules may process the substrate(s) S with the substrate in a desired orientation, established for example using a fiducial (not shown) on the substrate. Desired orientation for substrate(s) in processing modules may also be registered in the controller 170. Sealed section 110 may also have one or more intermediate chambers, referred to as load locks. The apparatus 100 shown in FIG. 1 has two load locks, load lock 135 and load lock 140. Load locks 135, 140 operate as interfaces, allowing substrates S to pass between front section 105 and sealed section 110 without violating the integrity of any environmentally sealed atmosphere that may be present in sealed section 110. Substrate processing apparatus 100 generally includes a controller 170 that controls the operation of substrate processing apparatus 100. In one embodiment the controller may be part of a clustered control architecture as described in U.S. patent application Ser. No. 11/178,615, filed on Jul. 11, 2005, the disclosure of which is incorporated by reference herein in its entirety. The controller 170 has a processor 173 and a memory 178. In addition to the information noted above, memory 178 may include programs including techniques for on-the-fly substrate eccentricity and misalignment detection and correction. Memory 178 may further include processing parameters, such as temperature and/or pressure of processing modules, and other portions or stations of sections 105, 110 of the apparatus, temporal information of the substrate(s) S being processed and metric information for the substrates, and programs, such as algorithms, for applying this ephemeris data of apparatus and substrates to determine on the fly substrate eccentricity.

The front end robot 120, also referred to as an ATM (atmospheric) robot, may include a drive section 150 and one or more arms 155. At least one arm 155 may be mounted onto drive section 150. The at least one arm 155 may be coupled to a wrist 160, which in turn is coupled to one or more end effector(s) 165 for holding one or more substrate(s) S. End effector(s) 165 may be rotatably coupled to wrist 160. ATM robot 120 may be adapted to transport substrates to any location within front section 105. For example, ATM robot 120 may transport substrates among substrate holding cassettes 115, 115a, 115b, load lock 135, and load lock 140. ATM robot 120 may also transport substrates S to and from the aligner 162. Drive section 150 may receive commands from controller 170 and, in response, direct radial, circumferential, elevational, compound, and other motions of ATM robot 120.

The vacuum robot arm 130 may be mounted in central chamber 175 of section 110. Controller 170 may operate to cycle openings 180, 185 and coordinate the operation of vacuum robot arm 130 for transporting substrates among processing modules 125, 125a-125f, load lock 135, and load lock 140. Vacuum robot arm 130 may include a drive section 190 (as will be described in greater detail below) and one or more end effectors 195. In other aspects, ATM robot 120 and vacuum robot arm 130 may be any suitable type of transport apparatus, including but not limited to, a sliding arm robot, a SCARA (selectively compliant articulated robot arm) type robot, an articulating arm robot, a frog leg type apparatus, or a bi-symmetric transport apparatus.

Referring to FIG. 2, there is shown a schematic plan view of another substrate processing apparatus 10 incorporating features in accordance with aspects of the disclosed embodiment. The substrate processing apparatus 10 is illustrated as having a linear or Cartesian arrangement in which substrates S are passed between transfer robots through an elongated transfer chamber. The substrate processing system 10, or tool, generally has a processing section 13 and an interface section 12. The interface and processing sections of the tool 10 are connected to each other and allow transport of workpieces there between. The processing section 13 of the tool may have processing modules or chambers, substantially similar to those described above with respect to FIG. 1. The processing modules may be linked by a workpiece transport chamber 16 in which the workpieces may be transported between desired processing modules according to the processing protocol. The transport chamber has a transport robot 20 capable of moving the workpieces therein and to the processing modules 125, 125a-125f. The processing modules 125, 125a-125f and the transport chamber are capable of being atmospherically isolated so they are able to hold a controlled atmosphere that is environmentally sealed from an exterior atmosphere in order to maintain atmosphere within the transport chamber the same as the processing modules, or suitable for workpieces being transferred between processing modules in a manner substantially similar to that described above with respect to FIG. 1. The tool interface section 12 provides a workpiece loading/unloading interface between the tool processing section 13 and its controlled sealed atmosphere and the tool exterior. An example of a suitable environmental interface section is disclosed in U.S. patent application Ser. No. 11/178,836, filed Jul. 11, 2005 incorporated by reference herein in its entirety. The tool interface section thus allows workpieces, that may be transported in carriers outside the tool, to be unloaded from the carrier into the tool and vice versa. The transport chamber may be made up of transport chamber modules, that may be connected end to end for example to form a linearly elongated transport chamber. The transport chamber length is thus variable by adding or removing transport chamber modules. The transport chamber modules may have entry/exit gate valves capable of isolating desired transport chamber module from adjoining portions of the transport chambers. Tool interface sections similar to section 12 may be positioned at any desired locations along the linearly elongated transport chamber allowing workpieces to be loaded or unloaded at a desired location in the tool. Processing modules may be distributed along the length of the transport chamber. The processing modules may be stacked in a direction angled to the length of the chamber. The transport chamber modules may have entry/exit gate valves to isolate desired transport chamber modules from the processing modules. The transport system 20 is distributed through the transport chamber. A number of the transport chamber modules may each have an integral movable arm having a fixed interface/mount to the module and movable end effector capable of holding and moving workpieces linearly along the transport chamber and between transport chamber and processing modules. Transport arms in different transport chamber modules may cooperate to form at least a portion of the linearly distributed transport system. Operation of the transport system, processing modules, processing section, interface section and any other portions of the tool may be controlled by controller 400 that may be substantially similar to controller 170 described above. The transport chamber and transport system therein may be arranged to define multiple workpiece travel lanes within the transport chamber. The travel lanes may be polarized or dedicated within the transport chamber for advance and return of workpieces. The transport chamber may also have intermediate load locks allowing different sections of the transport chamber to hold different atmospheres, and allow workpieces to transit between the different atmospheric sections of the transport chamber. The transport chamber may have an entry/exit station(s), where workpieces may be inserted/removed from a desired location of the transport chamber. For example, the entry/exit station may be located at an opposite end from the interface section 12 or other desired position in the transport chamber. The entry exit station(s) of the transport chamber may communicate with a workpiece express transit passage linking entry/exit station of the transport chamber with a remote tool interface section 12. The express transit passage may be independent of and isolatable from the transport chamber 16. The express transit passage may communicate with one or more of the interface section 12 so that workpieces may be transported between the interface section and transit passage. Workpieces may be rapidly placed into an advanced section of the tool and returned to the interface section 12 after processing via the express transit passage without affecting the transport chamber, and resulting in a reduction of work in process (WIP). The transport chamber may also have intermediate entry/exit stations, a number of which may communicate with the express transit passage so that workpieces may be transported there between. This allows workpieces to be inserted or removed at desired intermediate portions of the process without affecting the process stream as described in U.S. patent application Ser. No. 11/442,511 filed on May 26, 2006, the disclosure of which is incorporated herein by reference in its entirety.

The interface section 12 mates directly to the transport chamber (as shown in FIG. 1) without any intervening load locks. In other aspects a load lock may be placed between the interface section 12 and the transport chamber. The interface section shown in FIG. 2 has a workpiece transport 15 for moving workpieces from a cassette 115 mated to the load port LP, to the transport chamber 16. The transport 15 is located inside the interface section chamber 14, and may be substantially similar to the transport 150 described above. The interface section may also include workpiece station(s) A such as an aligner station, buffer station, metrology station and any other desired handling station for workpiece(s) S.

Figure 3:
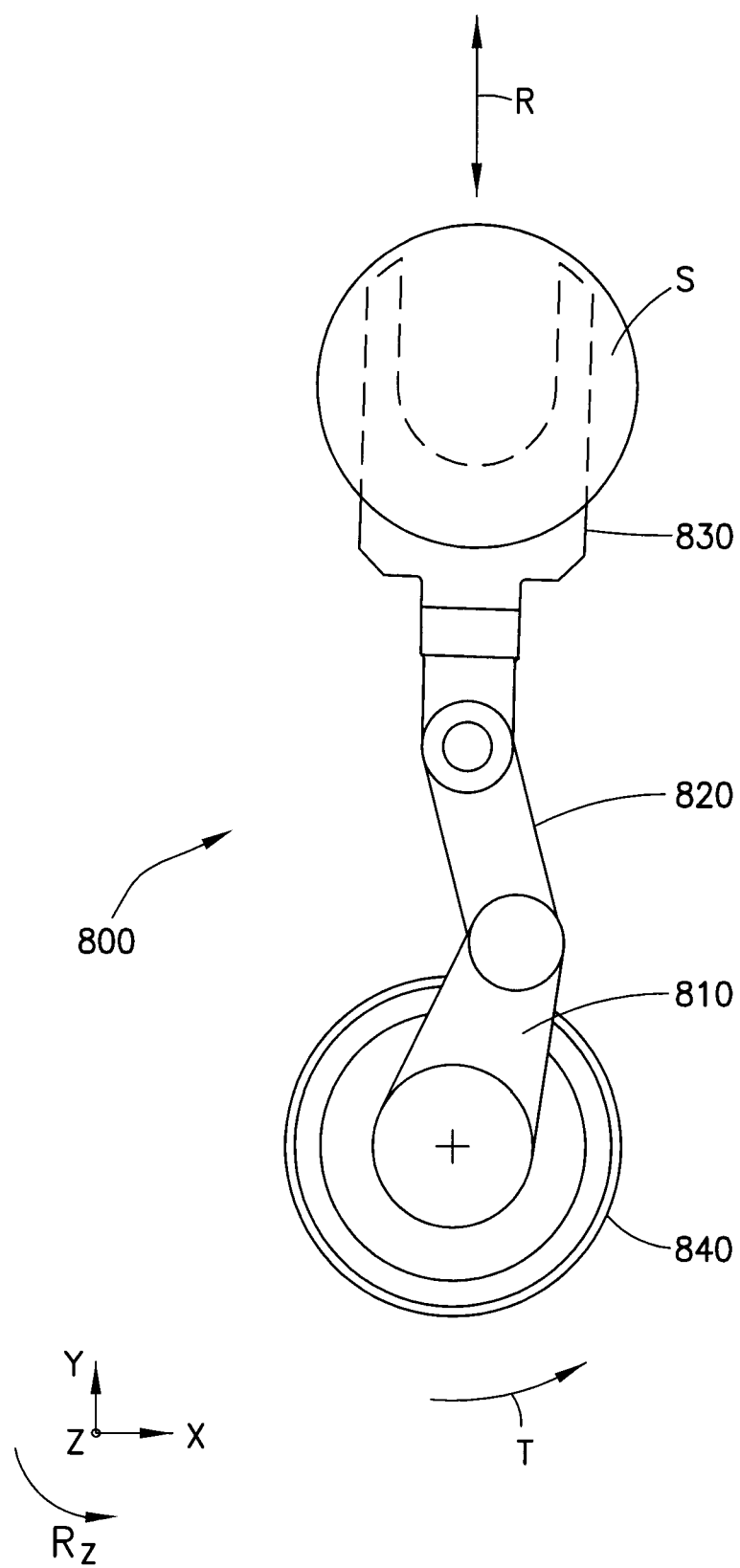
FIG. 3 is a schematic illustration of a substrate transport apparatus in accordance with aspects of the disclosed embodiment.

Although some aspects of the disclosed embodiment will be described herein with respect to a vacuum robot or transport, such as for example transport 800 of FIG. 3, it should be realized that the disclosed embodiment can be employed in any suitable transport or other processing equipment (e.g. aligners, etc.) operating in any suitable environment including, but not limited to, atmospheric environments, controlled atmosphere environments and/or vacuum environments. In one aspect, the transport 800 may have for example multiple independently movable end effectors for independently moving multiple workpieces. The transport 800 shown in FIG. 3 is illustrated for example as a multi-articulated link arm, that may have any suitable numbers of degrees of freedom in for example rotation, extension/retraction and/or lift (e.g. Z-axis motion). It should also be realized that the transports incorporating aspects of the exemplary embodiments can have any suitable configuration including, but not limited to, sliding arm robot configuration, the "frog leg" configuration of robot arm, the SCARA arm configuration of robot, an articulating arm robot or a bi-symmetric transport apparatus. Suitable examples of robot arms with which the drive system of the exemplary embodiments may be employed can be found in U.S. Pat. Nos. 4,666,366; 4,730,976; 4,909,701; 5,431,529; 5,577,879; 5,720,590; 5,899,658; 5,180,276; 5,647,724 and U.S. application Ser. No. 11/148,871 filed on Jun. 9, 2005; Ser. No. 12/117,415 filed on May 8, 2008; Ser. No. 11/697,390 filed on Apr. 6, 2007; Ser. No. 11/179,762 filed on Jul. 11, 2005; Ser. No. 13/293,717 filed on Nov. 10, 2011; and Ser. No. 13/417,837 filed on Mar. 12, 2012 the disclosures of which are incorporated herein by reference in their entireties.

Referring now to FIGS. 3 and 4A-4D, the exemplary transport apparatus 800 incorporating aspects of the disclosed embodiments will be described in greater detail in accordance with aspects of the disclosed embodiment. It is noted that while single SCARA arm is shown in FIGS. 3 and 4A-4D the aspects of the disclosed embodiments can be incorporated into any suitable type of robot arm such as those described above having any suitable number of robot arms. In this aspect the transport apparatus includes a frame 840, an upper arm 810, a forearm 820 and at least one end effector 830. A drive section 1600 may be located at least partially within the upper arm 810 and include at least one drive motor 1602A, 1602B. Here two motors 1602A, 1602B are shown for exemplary purposes as being stacked drive motors that are disposed, so that at least part of the stator 1603A, 1603B for each drive motor 1602A, 1602B is located in the arm link 810 (e.g. at least part of the stator for each drive motor is located in the same arm link, or a common arm link, or a single arm link, or one arm link). Each of the at least one drive motor 1602A, 1602B may include a stator 1603A, 1603B and a rotor 1604A, 1604B. The stators 1603A, 1603B may include stator windings that are wrapped around a stationary post 1610 that is fixed to the frame so that the post 1610 and the stator(s) 1603A, 1603B remain rotationally stationary relative to movement of the robot arm links 810, 820, 830. The rotors 1604A, 1604B may be configured such that the rotors surround the respective stators (e.g. inverted drive motors) to form a shaftless motor(s) that may provide a compact design and higher torque than conventional shaft drives. It is noted that the term "shaftless" denotes that there is substantially no extension portion or member between the rotor and the member driven by the rotor, where a height of the rotor is substantially coincident with or less than a height of the stator (e.g. height of the stator windings). By way of further example, an engagement interface between the rotor and the member driven by the rotor is proximate the stator. The stators and rotors may include characteristics such as those described in U.S. Pat. No. 7,834,618 and U.S. patent application Ser. No. 12/163,993 filed on Jun. 27, 2008 and Ser. No. 12/163,996 filed on Jun. 27, 2008 the disclosures of which are incorporated by reference herein in their entireties. Further, as will be described in greater detail below, encoders or other suitable sensors for determining rotatory position of the shaftless motors may be positioned within the profile space or dimension (e.g. height) of the stator so as to be included within the height of the shaftless motor or motor stack.

In this aspect the two drive motors 1602A, 1602B are stacked one above the other. The drive motors 1602A, 1602B may be stackable to allow for easy adoption of multiple motors for providing any suitable number of degrees of freedom for driving any suitable number of arm links. In other aspects, any suitable number of drive motors (i.e. at least one or more) may be used in any suitable configuration having any number of suitable drives, such as, but not limited to, a stacked inverted drive configuration, an in-line inverted drive configuration, or any other suitable configuration. Here the rotor 1604A of drive motor 1603A is shaftlessly coupled to the arm link 810 so that as the rotor 1604A rotates the arm link 810 rotates with it. For example, the rotor 1604A may be mounted in any suitable manner to a lower surface of the arm link 810. The rotor 1604B of motor 1603B may include (either integrally formed with or coupled to) a pulley 1605. The pulley may be coupled to an elbow pulley 1620 through any suitable transmission member 1605X. In one aspect, the transmission member 1605X may be a belt, band, wire or any other suitable transmission member. The elbow pulley 1620 may be suitably connected to the forearm 820 in any suitable manner such that as the rotor 1604B rotates it causes the forearm 820 to rotate about an elbow axis of rotation EX.

Figure 4A:
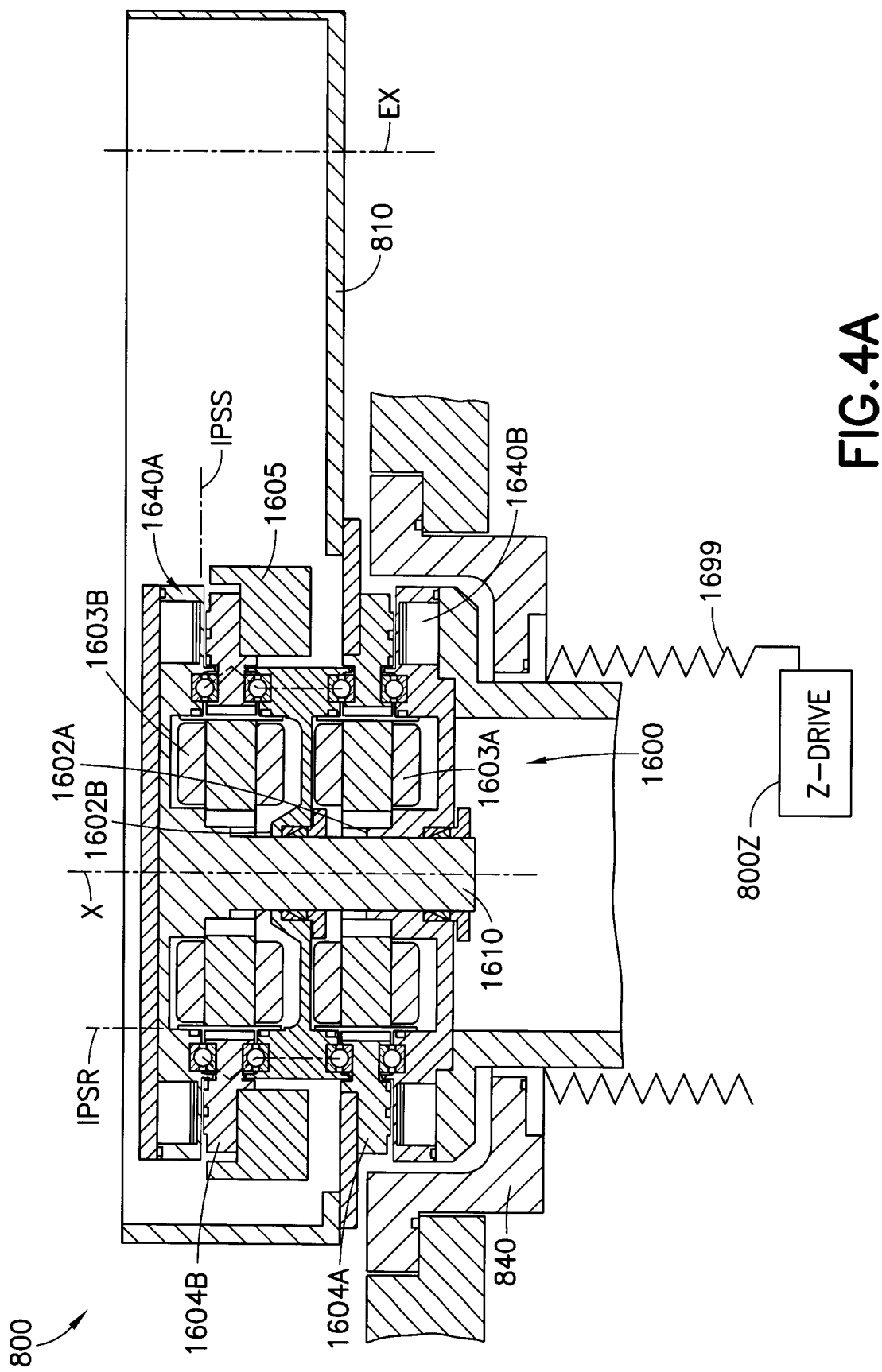
FIGS. 4A-4D are a schematic cross-sectional views of a robot drive system in accordance with aspects of disclosed embodiment.
Figure 4B:
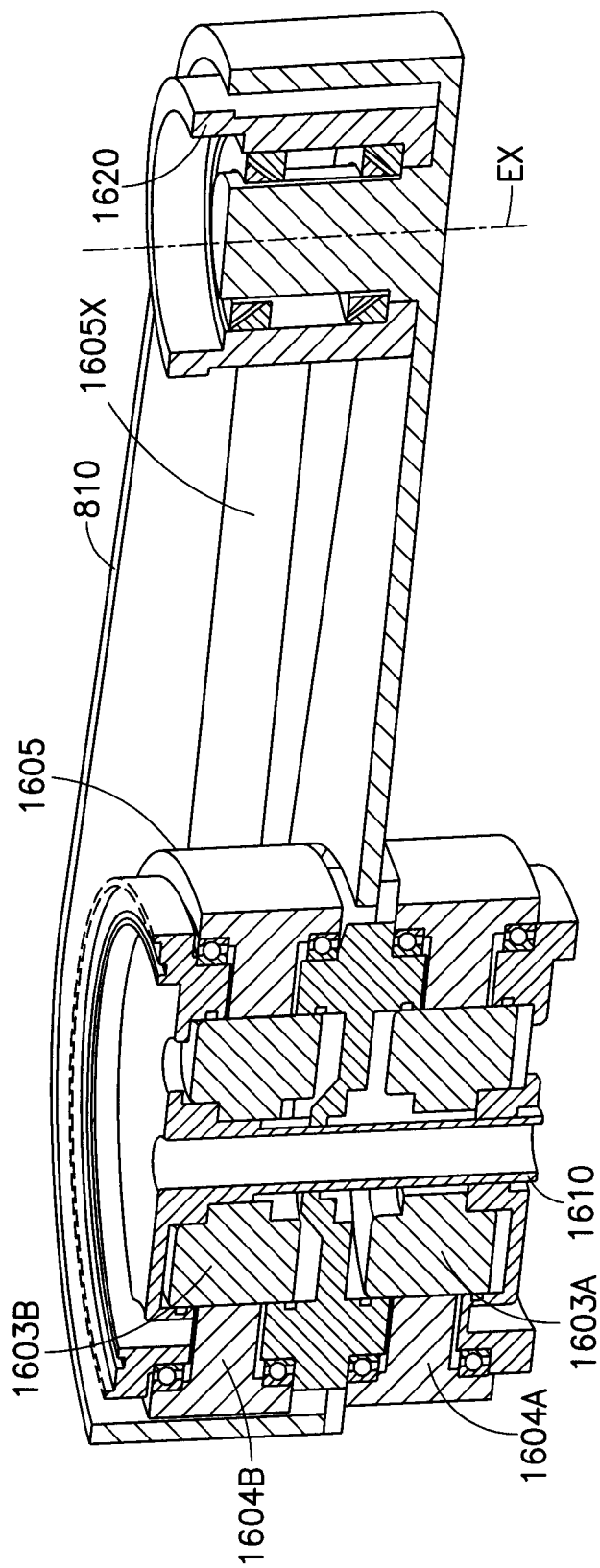
Figure 4C:
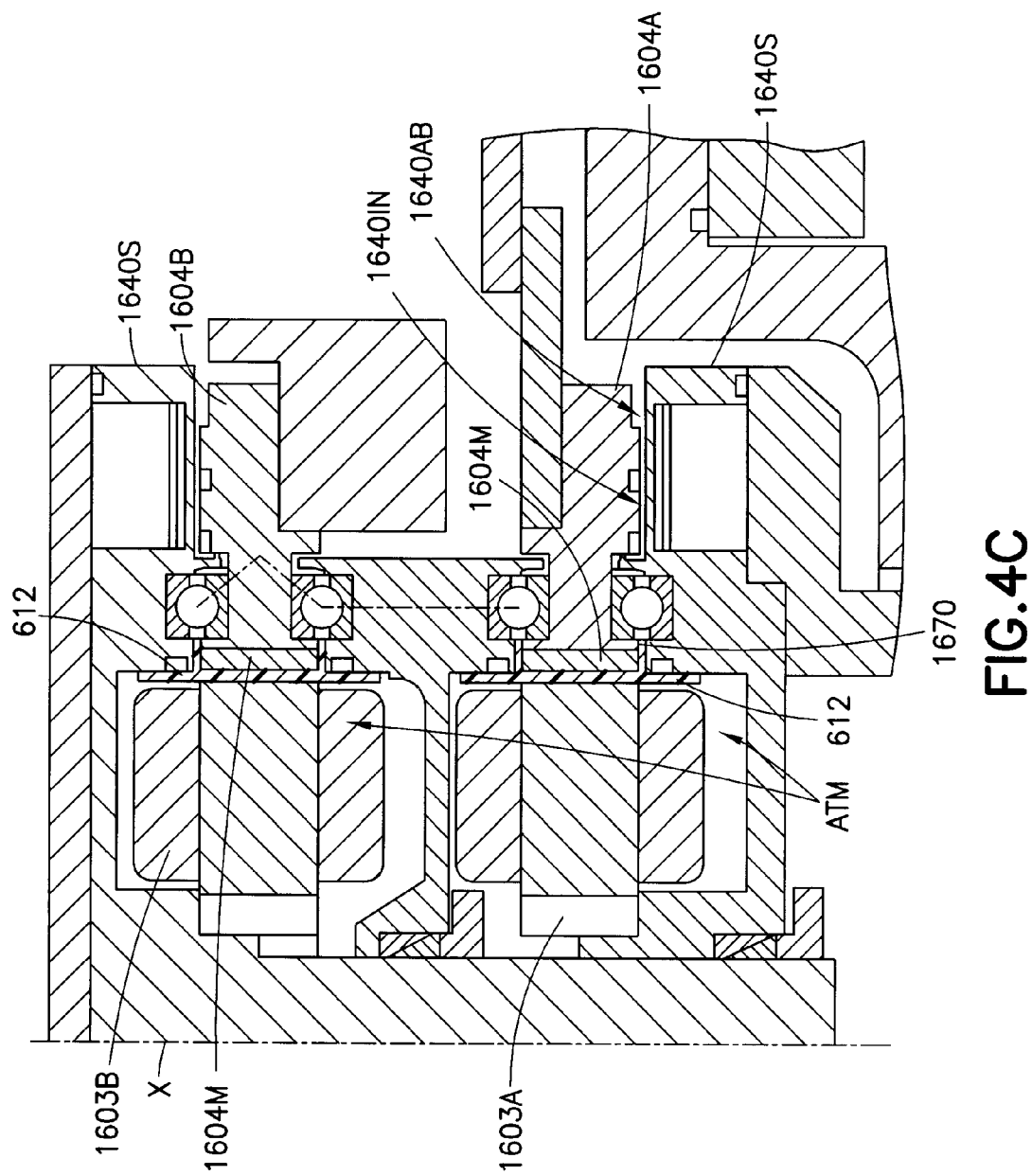
Figure 10:
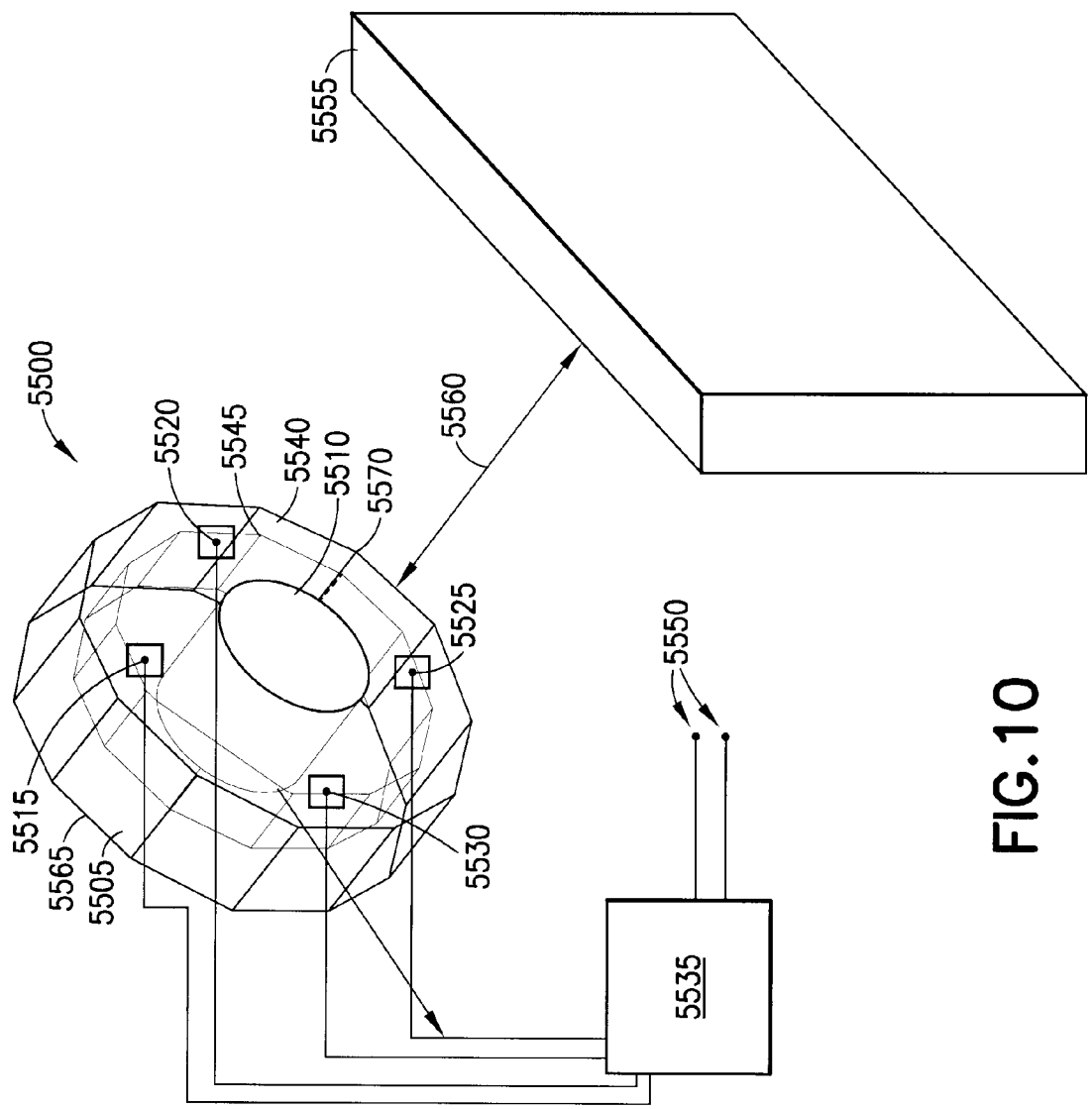
FIG. 10 illustrates a portion of an exemplary sensor system in accordance with aspects of the disclosed embodiment.
Figure 11:
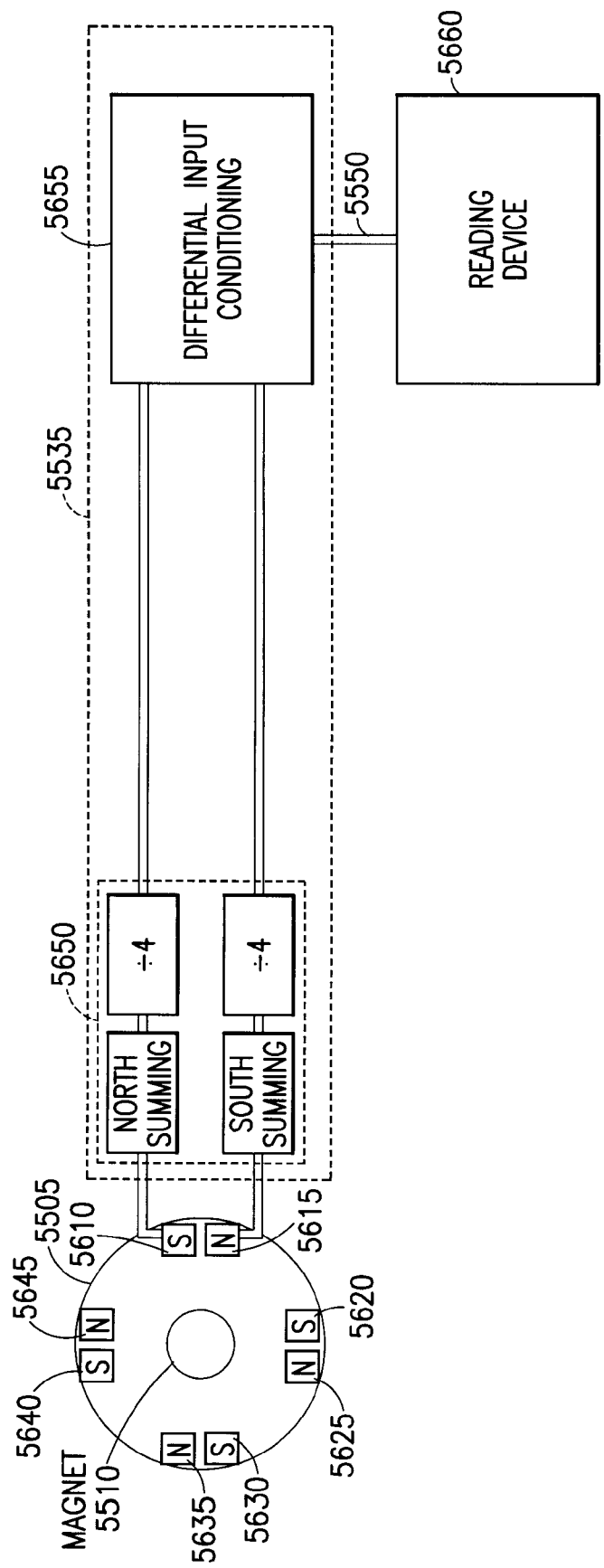
FIG. 11 illustrates an exemplary arrangement of magnetic sensors around a ferromagnetic element in accordance with aspects of the disclosed embodiment.

Referring also to FIGS. 10 and 11, the inverted drives 1602A, 1602B may include any suitable sensors for tracking the rotation of the rotors 1604A, 1604B. In one aspect, any suitable encoders 1640A, 1640B may be provided at suitable locations for sensing the rotation of a respective one of the rotors 1604A, 1604B. In one aspect the encoders 1640A, 1604B may interface directly with a respective rotor 1604A, 1604B (e.g. the sensor scale is integrated into the rotor) where the encoders 1640A, 1640B are stationarily located on or depend from the fixed post 1610 such that the interface plane between the sensor system 5500 and scale (or ferromagnetic target) 5555 of the encoder is arranged, for example, at an angle relative to the interface plane between the stator 1603A, 1603B and the rotor 1604A, 1604B so that the sensor system 5500 may be disposed substantially within a height of the stator 1603A, 1603B. For exemplary purposes only, the interface plane IPSS between the sensor system 1500 and the ferromagnetic target 5555 is shown as being substantially orthogonal to the interface plane IPSR between the stator 1603A, 1603B and the rotor 1604A, 1604B. The rotors 1604A, 1604B can include any suitable scales or ferromagnetic targets 5555 such as incremental scales 16401N (FIG. 4C) or absolute scales 1640AB (FIG. 4C) which the sensor system 5500 of the encoders 1640A, 1640B detect for position measurement. It is noted that any suitable seal(s) 1640S (FIG. 4C) may be provided for sealing or otherwise isolating the encoders 1640A, 1640B from, for example, the environment (e.g. vacuum environment or otherwise) in which the transport apparatus arms operate. For example, seals 1640S may be disposed between the encoders 1640A, 1640B and their respective rotors. The seals 1640S may be configured such that the encoders 1640A, 1640B are capable of reading or otherwise sensing/detecting the scales or ferromagnetic targets 5555 such as incremental scales 16401N (FIG. 4C) or absolute scales 1640AB (FIG. 4C).

FIG. 10 shows an exemplary sensor system 5500 suitable for use with the aspects of the disclosed embodiment described herein. Sensor system 5500 may utilize any suitable magnetic circuit principles, for example, such as those described in U.S. Pat. No. 7,834,618 (the disclosure of which is incorporated herein in its entirety) to read incremental or absolutely position scales and/or a distance from the ferromagnetic target 5555 to, for example, the sensor system's reference frame. The ferromagnetic target 5555 may be a flat or curved surface or have any suitable profile attached to, embedded in, or otherwise integral to the target such as, for example, the scales discussed above. The sensor system 5500 may include a ferromagnetic element 5505, a magnetic source 5510, for example, a permanent magnet, a number of magnetic sensors 5515, 5520, 5525, 5530 and conditioning circuitry 5535. The ferromagnetic element 5505 may circumscribe the magnetic source 5510. In other aspects, the ferromagnetic element 5505 may surround or even enclose the magnetic source 5510. In at least one exemplary embodiment, the ferromagnetic element 5505 may have a cup shape with a closed end 5565 and an open end 5570. The magnetic source 5510 may have a cylindrical shape where the direction of magnetization is parallel to the axis of symmetry of the ferromagnetic element 5505. The magnetic source 5510 may be a permanent magnet, an electromagnet, or any other suitable source of magnetic energy. The magnetic source 5510 may be attached within the ferromagnetic element to the center of the ferromagnetic element 5505 by attractive forces and may be held in place using a suitable fastener, for example an adhesive. In one aspect, the sensor system 5500 may be oriented such that the open face 5570 of the cup faces the ferromagnetic target 5555.

The sensor system 1500 illustrated in FIG. 10 may establish a magnetic circuit between the ferromagnetic element 5505 and the magnetic source 5510 such that the flux density is symmetric about the axis of the cup or any concentric perimeter between the magnetic source 5510 and the ferromagnetic element 5505. The shape of the ferromagnetic element 5505 influences the shape of the magnetic field. In aspects where the ferromagnetic element 1505 is cup shaped, the magnetic field is relatively confined, resulting in an increased sensitivity to variations in the distance 5560 to the ferromagnetic target. The ferromagnetic element 5505 may have a shape tailored to create a specifically shaped magnetic field. In some aspects the ferromagnetic element 5505 may also be fashioned to provide a specific sensitivity to distance variations between the sensor system 5500 and the ferromagnetic target 5555.

Magnetic sensors 5515, 5520, 5525, 5530 may operate to sense the flux density and may be located in an orbital configuration at a constant radial distance from the axis of symmetry of the ferromagnetic element 5505. The magnetic sensors may also be positioned such that their outputs are approximately the same. While four magnetic sensors are shown, it should be understood that any suitable number of magnetic sensors may be utilized. Outputs of the magnetic sensors 5515, 5520, 5525, 5530 may be provided to any suitable conditioning circuitry 5535. Conditioning circuitry 5535 may include signal processing circuitry for processing the sensor outputs, for example, to provide compensation, filtering, noise reduction, or any other suitable signal processing. The sensor output signals may generally be processed to provide a sensor system output 5550. The use of additional sensors may improve the noise immunity of the system. The ferromagnetic element 5505 may also operate as a magnetic isolation cage for the magnetic sensors minimizing external magnetic interference from the surrounding environment. The sensor system 5500 is thus configured to measure alterations in the magnetic flux density vector detected by the magnetic sensors. In one aspect, the sensor system 5500 may measure alterations in the magnetic flux density vector due to the presence of the ferromagnetic target 5555.

FIG. 11 shows an exemplary arrangement of magnetic sensors around the ferromagnetic element. In this aspect magnetic sensors may be arranged in pairs 5610 and 5615, 5620 and 5625, 5630 and 5635, 5640 and 5645 with alternating orientations relative to the flux density lines between the ferromagnetic element 5505 and the magnetic source 5510. In this aspect, each sensor pair may provide a differential output. Summing 5650 and differential conditioning 5655 circuitry may be part of conditioning circuitry 5535 and may further provide sensor system output 5550 as a differential signal. The use of differential outputs may improve noise immunity, in particular where signals have low levels, are subject to a hostile electrical electromagnetic environment, or travel any appreciable distance. For example, providing sensor system output 5550 as a differential signal may improve noise immunity as the output is provided to reading device 5660.

In other aspects, the magnetic sensors do not have to be placed at equal radial distance from the axis of symmetry and that their outputs need not be necessarily equal and yet the outputs can be suitably processed to yield the effective target distance. It should be understood that any number of magnetic sensors may be used, either ungrouped, or grouped together in any suitable number or arrangement.

Returning to FIG. 10, the ferromagnetic target 5555, once located in front of the sensor system 5500 alters the magnetic flux density vector detected by magnetic sensors 5515, 5520, 5525, 5530, thus affecting output signal 5550. The distance 5560 between the target 5555 and the sensor system may determine the value of sensor system output 5550. The sensor system output 1550 may vary according to any magnetic flux variations introduced by one or more scales that may be attached to or integral with ferromagnetic target 5555.

The shape of the magnetic source 5510 and the ferromagnetic element 5505 may be modified to obtain a particular flux density pattern or configuration, or to optimize or otherwise improve the sensor system output 5550 or the distance 5560. For example, in some embodiments, at least one of the ferromagnetic element 5505 and the magnetic source 1510 may have the shape of a cylinder, cone, cube or other polyhedron, paraboloid, or any other suitable shape. As mentioned above, any number of sensors may be utilized. Furthermore, the sensors may have any suitable arrangement for obtaining a particular flux density pattern, or for optimizing the sensor system output 1550 or the distance 1560.

The sensor system 5500 is suitable for use in the aspects of the disclosed embodiment described herein, for example, through a wall of non-magnetic material that may isolate a target rotor or scale from the sensor system. The sensor system 5500 is suitable for use in vacuum automation system embodiments. The sensor system 5500 is particularly suited for measuring magnetic flux, gaps and scales for all of the aspects of the disclosed embodiment described herein.

Referring again to FIGS. 3 and 4A-4D, as may be realized, in one aspect the transfer apparatus 800 may include a Z-drive 800Z for moving the robot arm linearly along a central axis of rotation X of the arm. A bellows or other suitable seal 1699 may be provided for accommodating relative axial movement (e.g. vertical, Z-axis) between the at least one arm link and frame wherein the seal is located on one side of the arm and the drive motors 1602A, 1602B (e.g. drive section) are located on the opposite side of the arm. As may be realized this arrangement allows the length of the stationary post 1610 to be independent or decoupled from the length of the z-stroke provided by the Z-axis drive.

Figure 4D:
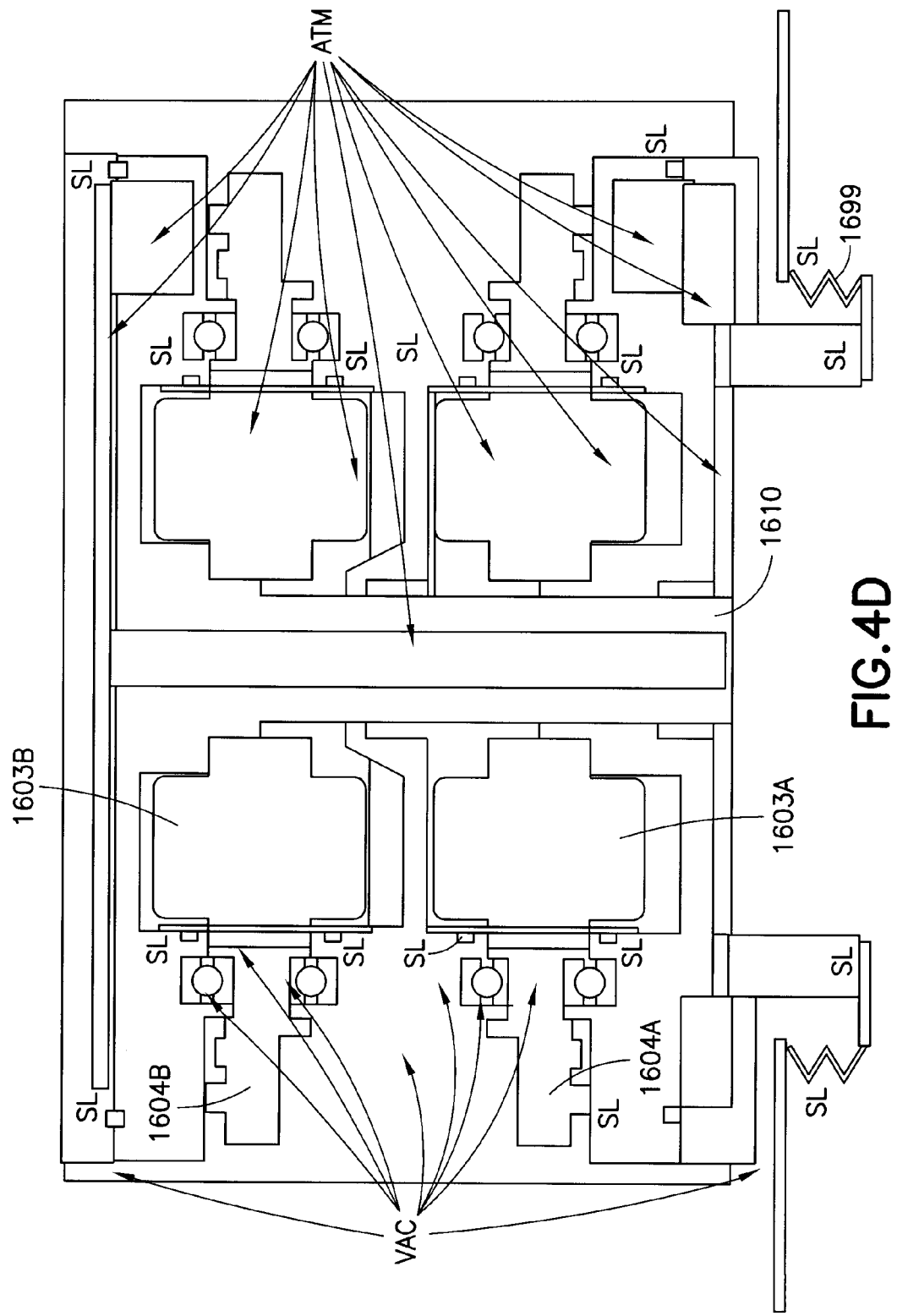

Referring to FIGS. 4C and 4D, sealing of the drive section within the arm 810 will be described. As can be seen, the stators 1603A, 1603B may be isolated from the vacuum environment in which the robot arm operates in any suitable manner. In one aspect, isolation may be done by the use of any suitable barrier, for example barrier 612. In other aspects, any suitable means of isolating the stators 1603A, 1603B may be used. Magnets 1604M of the rotors 1604A, 1604B may also be isolated from the vacuum in any suitable manner. In one aspect, magnetic isolation may be achieved with, e.g., a ferrofluidic seal 1670. In other aspects, any suitable means of magnet isolation may be used to isolate the rotor magnets from the vacuum environment in which the robot arm operates. In yet alternate embodiments, variable reluctance motors may be used to remove the need for the magnet. FIG. 4D is an exemplary illustration of seal SL locations for sealing the vacuum environment in which the robot arm operates.

It is noted that the drive motors of disclosed herein may be applied to any suitable drive system such as, for example, those disclosed in U.S. patent application Ser. No. 12/175,278 filed on Jul. 7, 2008; Ser. No. 13/270,844 filed on Oct. 11, 2011; and Ser. No. 13/270,844 filed on Oct. 11, 2011 the disclosures of which are incorporated by reference herein in their entireties.

Figure 5A:
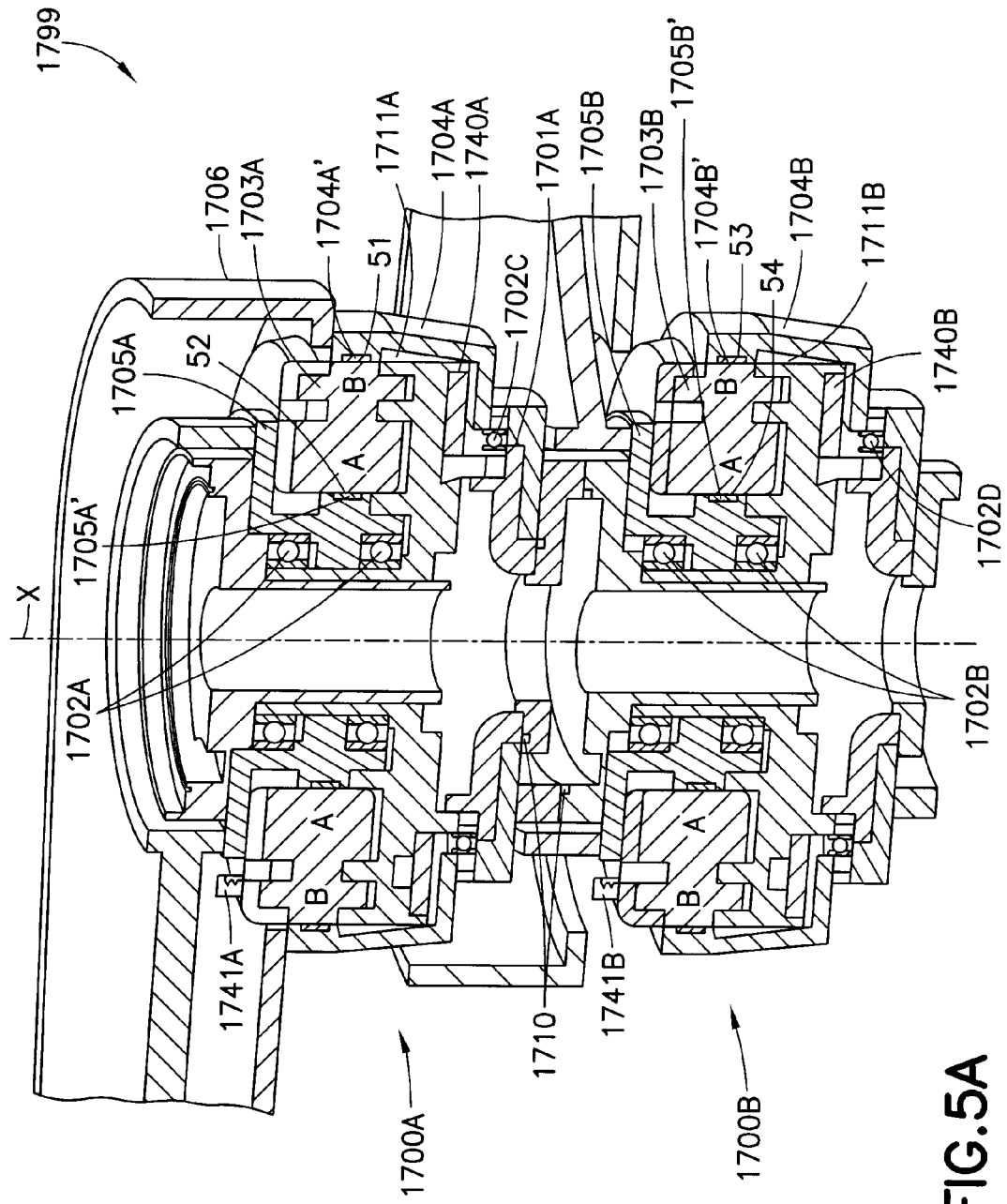
FIG. 5A is a schematic cross-sectional view of a portion of a transfer apparatus in accordance with aspects of the disclosed embodiment.
Figure 5B:
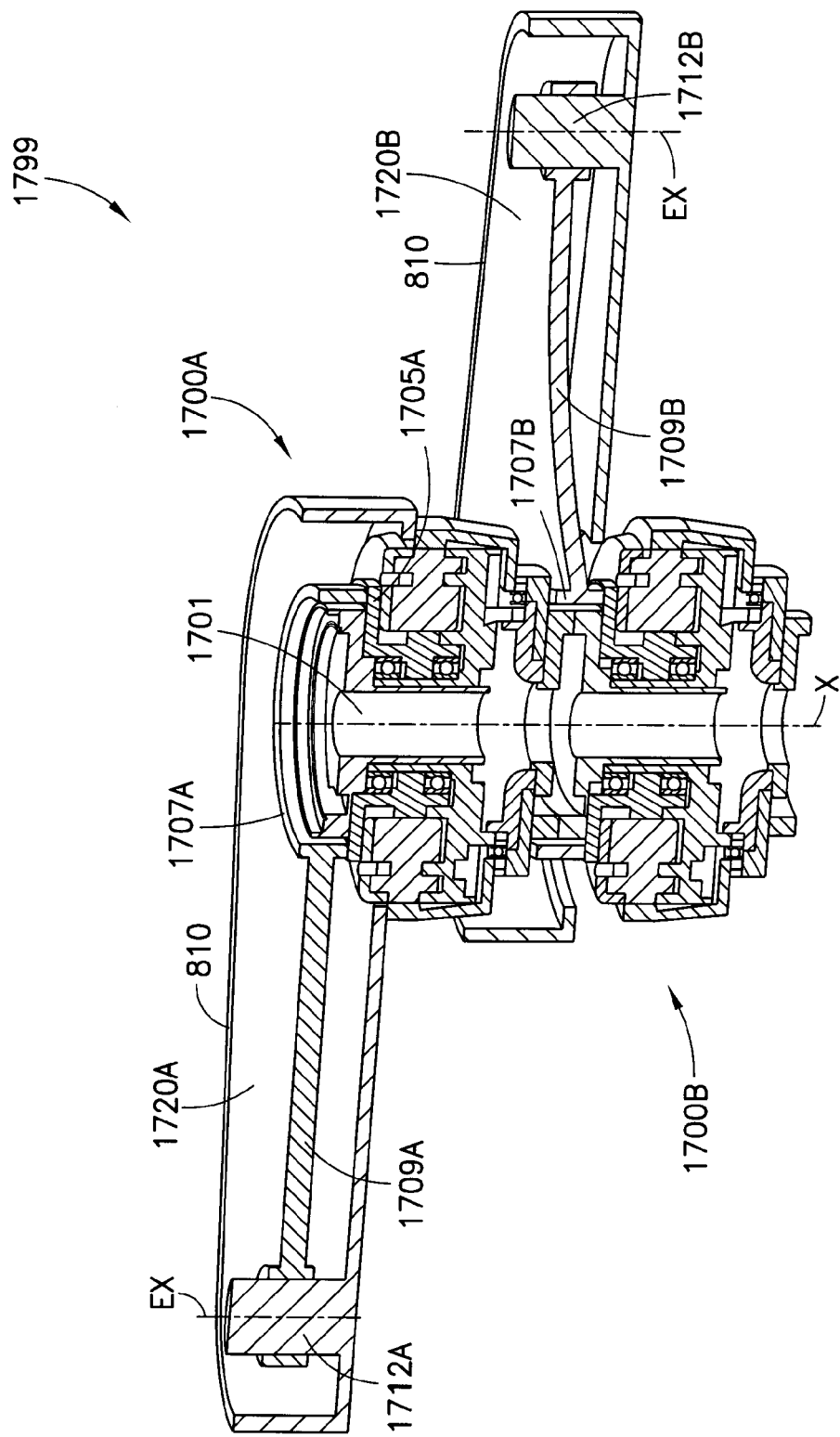
FIG. 5B is a schematic cross-sectional view of a portion of the transfer apparatus of FIG. 5A in accordance with aspects of the disclosed embodiment.

Referring now to FIGS. 5A and 5B, in another aspect of the disclosed embodiment, a portion of an exemplary transport apparatus 1799 is disclosed. The exemplary transport apparatus may be substantially similar to the transport apparatus 800 described above in that the transport apparatus may include, for example, a frame, at least one or more shaftless drive sections, Z-motors allowing for motion along the Z-axis, and at least one or more robot arms. The at least one or more drive sections may be mounted to the frame, such as frame 840 at a shoulder axis of rotation X in order to rotate links of a robot arm for effecting extension/retraction of the arm. The one or more drive sections may further be connected to a Z-motor/drive system to allow for movement of the robot arm along the Z-axis in a direction substantially perpendicular to an axis of extension/retraction R (FIG. 3) of the arm. The exemplary aspect of the disclosed embodiment shown in FIGS. 5A and 5B includes at least two drive sections 1700A and 1700B and having two robot arms 1720A, 1720B (which may be substantially similar to the robot arm described above with respect to FIG. 3 in that the arm includes an upper arm 810, forearm 820 and at least one end effector 830). In other aspects the transport apparatus 1799 may include more or less than two robot arms and two drive sections (e.g. the transport apparatus 1799 has at least one robot arm and at least one drive section). In one aspect the drive sections 1700A, 1700B may be disposed or distributed between or "layered" with the arms 1720A, 1720B such that one drive section 1700A is disposed substantially between the arms 1720A, 1720B while the other drive section 1700B is disposed on an opposite side of an arm such as below arm 1720B (or above arm 1720A). In another aspect, the drive sections 1700A, 1700B may be disposed at least partially within a respective arm 1720A, 1720B. In still another aspect both drive sections 1700A, 1700B may be disposed between the arms 1720A, 1720B such that the drive sections 1700A, 1700B have a mirrored or inverted configuration relative to one another (e.g. drive section 1700A is connected to the arm 1720A from the bottom of the arm and drive section 1700B is connected to arm 1720B from a top of the arm). In other aspects of the disclosed embodiment, other configurations may be possible—for instance configurations having only one drive section and one robot arm, or configurations having more than two drive sections with more than two robot arms, or in-line configurations having multiple drive sections arranged within the same plane within a robot arm, or configurations having one or more Z-drives or any combination thereof. In yet other aspects, any suitable configuration of the transport apparatus may be possible such that the drive motors of FIGS. 5A and 5B are incorporated into the transport apparatus configuration.

In this aspect, a post 1701 is fixed to the frame 840. The fixed post 1701 may, in one aspect of the disclosed embodiment, be segmented (see 1701A in FIG. 5A), e.g. having different sections or portions coupled to each other. The different portions of the fixed post 1701A may be coupled together in any suitable manner. Any suitable seals may also be provided between the different portions of the fixed post 1701A, such as, for example, seals 1710. In other aspects, the fixed post 1701 may have a unitary one-piece construction or any other suitable configuration. The one or more robot arms 1720A, 1720B may be rotatably mounted to fixed post 1701 in any suitable manner such as described below. Each robot arm 1720A, 1720B may include its own drive section that includes an inner rotor 1705A, 1705B, a stator 1703A, 1703B, and an outer rotor 1704A, 1704B.

The inner rotor 1705A, 1705B may be movably mounted to the fixed post 1701 in any suitable manner so that the inner rotor 1705A, 1705B may be free to rotate about the fixed post 1701. The inner rotor 1705A, 1705B may be supported on the fixed post 1701 in any suitable manner, such as by, for instance, bearings 1702A, 1702B. In other aspects of the disclosed embodiment, bearings may be disposed in any other suitable locations other than that shown in FIGS. 5A and 5B to support the inner rotor 1705A, 1705B. The inner rotors 1705A, 1705B may be nested within the stator 1703A, 1703B, such that the stator 1703A, 1703B surrounds or circumscribes a periphery of the inner rotor 1705A, 1705B (e.g. is concentric with the inner rotor 1705A, 1705B) and lies in the same plane so that the inner rotors 1705A, 1705B may rotate freely about the fixed post 1701. The inner rotor 1705A, 1705B may be configured to interface with the stator and include, for example, suitable interfacing components 1705A', 1705B' such as magnets configured to effect the interface between the inner rotor and the stator.

Referring still to FIGS. 5A and 5B, the stator 1703A, 1703B may also be connected to the fixed post 1701 to be rotationally stationary relative to the fixed post 1701. In one aspect of the disclosed embodiment, the stator 1703A, 1703B may be connected in any suitable manner to the fixed post 1701 or frame 840 (FIG. 3) so that the stator 1703A, 1703B is rotationally stationary with respect to the fixed post 1701. Each of the stators 1703A, 1703B may be a segmented stator, for example, the stators 1703A, 1703B may be segmented so as to include two individually operable sets of windings. One segment, for instance, segment A of stators 1703A, 1703B may be configured to drive the inner rotors 1705A, 1705B. The other segment, for instance, segment B of stators 1703A, 1703B may be configured to drive the outer rotors 1704A, 1704B. Each segment A, B may be suitably sized to provide a desired torque for rotating the respective arm link. For example, stator segment A may be larger than stator segment B to provide sufficient torque for rotating the inner rotor 1705A, 1705B which may have a smaller diameter than the outer rotor 1704A, 1704B (e.g. the portion of the inner rotor interfacing with the stator may be of a smaller diameter than the portion of the outer rotor interfacing with the stator). In other aspects, segment B may be larger than segment A or segments A and B may be substantially the same size. It is also noted that in one aspect, the winding segments A, B may be formed by nesting two sets of coils within one another. In other aspects, the coils for the inner and outer windings may be nested to each other as two parts. Each segment A, B of stators 1703A, 1703B may be controlled by a controller, such as controller 170, 400 configured for individually energizing each segment A, B, so that each segment A, B, of stators 1703A, 1703B may drive their corresponding inner and outer rotors (1705A, 1705B and 1704A, 1704B, respectively) independently of each other. In other aspects, segments A, B of stators 1703A, 1703B may be controlled by any suitable controller or controllers so that the corresponding inner and outer rotor may be driven in unison or otherwise together. In yet another aspect of the disclosed embodiment, the stators 1703A and 1703B may be composed of two separate stators (corresponding substantially to segments A and B) wherein one stator (e.g., an inner stator) may be arranged to be nested inside the other stator (e.g., an outer stator) so that the outer stator substantially surrounds the periphery of the inner stator.

In one aspect of the disclosed embodiment, the outer rotor 1704A, 1704B may extend around and substantially surround the fixed post 1701 and substantially surround the periphery of the stator 1703A, 1703B so that the stator 1703A, 1703B may substantially be nested within the outer rotor 1704A, 1704B. The outer rotor 1704A, 1704B is further arranged so that it freely rotates about the stationary stator 1703A, 1703B. The outer rotor 1704A, 1704B may be supported on fixed post 1701 in any suitable manner such as by, for instance, bearings 1702C, 1702D so as to be freely rotatable independent of the fixed post 1701. In alternate aspects, the outer rotor 1704A, 1704B have any suitable configuration and be mounted to any suitable structure of the transport apparatus 1799 so as to be freely rotatable relative to the fixed post and/or stator 1703A, 1703B. The outer rotor 1704A, 1704B may be configured to interface with the stator and include, for example, suitable interface components 1704A', 1704B' such as magnets configured to effect the interface between the outer rotor and the stator.

It is noted that in one aspect of the disclosed embodiment, the rotors described herein may use permanent magnets, but in other aspects, as noted above, the rotors may also be configured as a reluctance style rotor or any other suitable rotor type. Other examples of a drive section having nested rotors and stators are described in U.S. Pat. No. 7,891,935 and U.S. application Ser. No. 13/030,856 filed Feb. 18, 2011, the disclosures of which are incorporated by reference herein in their entireties.

Referring still to FIGS. 5A and 5B, the two drive sections 1700A and 1700B are arranged in a stacked configuration such that a drive section is disposed at the shoulder of each respective arm about the shoulder axis X. As noted above, drive sections 1700A, 1700B and arms 1720A, 1720B may be configured to have any suitable number of degrees of freedom and any suitable configuration. In one aspect the two drive sections 1700A and 1700B and arms 1720A, 1720B may be substantially similar to each other and as such the drive sections 1700A, 1700B will be described with respect to drive section 1700A of arm 1720A. In one aspect the inner rotor 1705A may be connected, for instance, to a pulley 1707A in any suitable manner so that as the inner rotor 1705A rotates, the pulley 1707A rotates with the inner rotor 1705A. The pulley 1707A may be integral to the inner rotor 1705A (i.e. of one-piece construction with the rotor) or may be coupled to the inner rotor 1705A in any suitable manner. As pulley 1707A rotates, the pulley 1707A may, through any suitable transmission member 1709A, turn another pulley 1712A disposed about the elbow axis EX in the elbow of the robot arm for rotating the forearm 820 (FIG. 3) relative to the upper arm 810. The outer rotor 1704A may, in turn, be connected to the upper arm in any suitable manner. In one aspect of the disclosed embodiments, the outer rotor 1704A may be directly coupled to the upper arm so that as the outer rotor 1704A rotates, the upper arm will rotate with the outer rotor 1704A. In alternate aspects, the outer rotor 1704A may be connected to the upper arm through an arm interface (not shown) so that as the outer rotor 1704A rotates, the upper arm will rotate with the outer rotor 1704A via the arm interface. As noted above, because drive sections 1700A and 1700B are substantially similar, this configuration may also be used for drive section 1700B (see e.g. inner rotor pulley 1707B, transmission 1709B and elbow pulley 1712B and outer rotor 1704B may be connected to the upper arm 810 of arm 1720B for rotating the upper arm). In alternate aspects, any other suitable configuration may be used.

Referring still to FIGS. 5A and 5B, the drive sections 1700A and 1700B may include any suitable sensors for tracking the rotation of the drive sections in a manner substantially similar to that described above. For example, referring to drive section 1700A (drive section 1700B may be similarly configured), an encoder 1741A (see also encoder 1741B for drive section 1700B) may be disposed for the tracking rotation of the inner rotor 1705A (or rotor 1705B in the case of drive section 1700B), while a second encoder 1740A (see also encoder 1740B for drive section 1700B) may be configured for tracking the rotation of the outer rotor 1704A (or rotor 1704B in the case of drive section 1700B). The encoders 1740A and 1741 may be substantially similar to the previously described encoders 1640A, 1640B. The encoders may be disposed in any suitable position or location within the transport apparatus to enable the tracking of rotation and may be configured to use any scale including, but not limited to absolute scales, incremental scales or any other suitable scale.

The drive sections 1700A and 1700B may also be configured to include atmospheric/vacuum sealing. For instance, stator 1703A, 1703B may be isolated from the vacuum environment in which the robot arm may operate in any suitable manner. For instance, isolation may be done by any suitable barrier, such as, for instance, barriers 1711A, 1711B. In one aspect of the disclosed embodiment, the magnet 1705A', 1705B' of an inner rotor 1705A, 1705B may also be isolated from the vacuum environment in any suitable manner, such as that described above. In another aspect, of the disclosed embodiment, the magnet 1704A', 1705B' of outer rotor 1704A, 1704B may also be isolated from the vacuum environment in any suitable manner, such as that described above. For example, one such means of isolating the magnets 1705A', 1705B', 1704A' and 1704B' may be a ferrofluidic seal S1, S2, S3 and S4 similar to the seals described above. In yet another aspect of the disclosed embodiment, the drive sections disclosed may also use variable reluctance motors to remove the need for magnets.

In the aspect of the disclosed embodiment shown in FIGS. 5A and 5B, only two degrees of freedom were disclosed within the drive section. However, in other aspects of the disclosed embodiment, it is possible to increase the numbers of degrees of freedom within the drive sections by having additional stators and rotors (not shown) disposed between the inner and outer rotors so that the additional stators and rotors will increase the number of degrees of freedom that can be utilized by the robot arms. Any suitable number of stators and rotors may be concentrically arranged and nested in a manner substantially similar to that described above.

Figure 6:
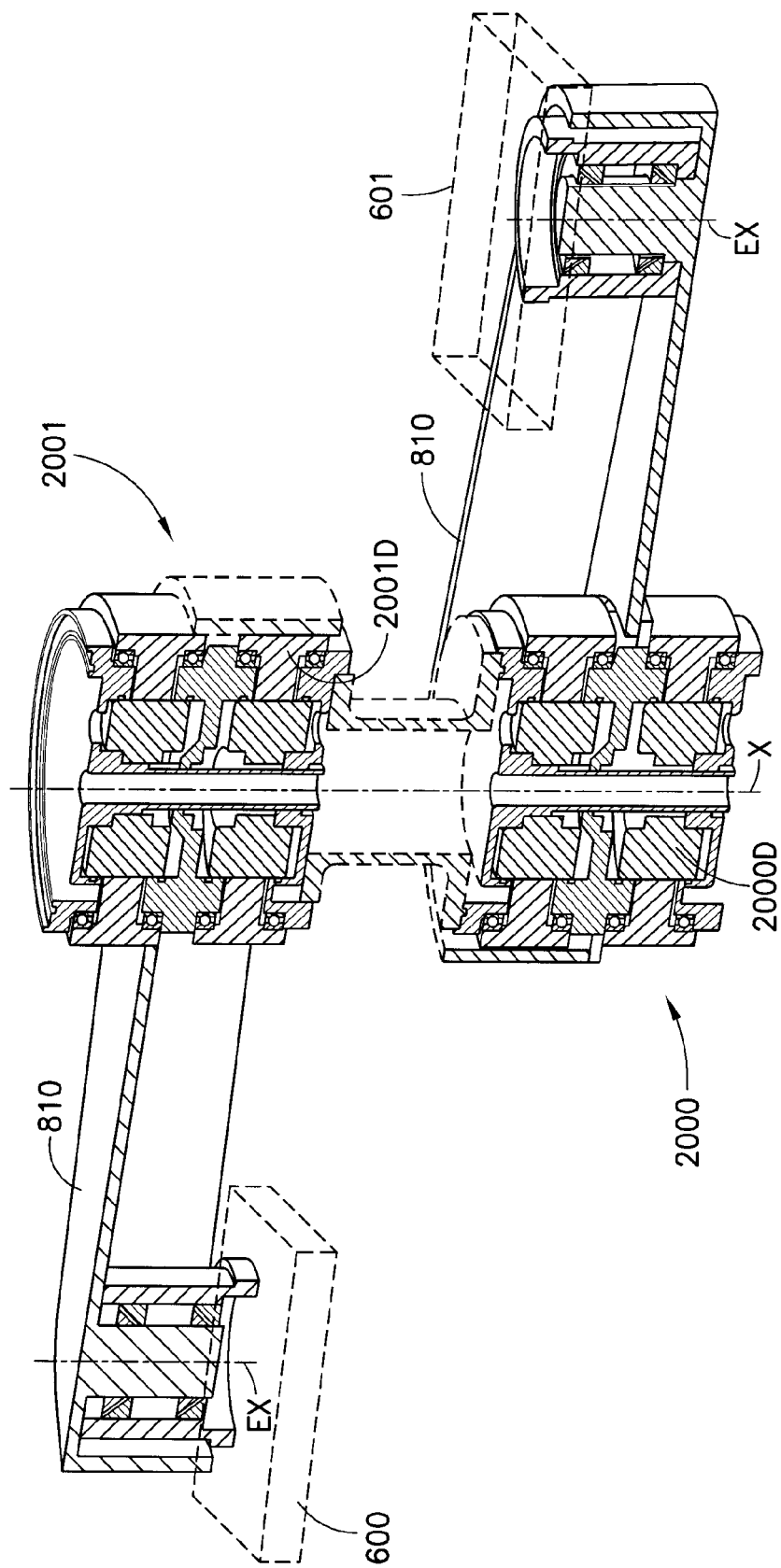
FIG. 6 is a schematic cross-sectional view of a portion of a transfer apparatus in accordance with aspects of the disclosed embodiment.

Referring now to FIG. 6, a portion of dual arm transport apparatus is shown in accordance with aspects of the disclosed embodiment. It is noted that the connections between the drive motors and the arms (e.g. the manner in which the arms are driven) may be any suitable connections such as those described in U.S. Pat. Nos. 5,720,590; 5,899,658 and 5,813,823 the disclosures of which are incorporated by reference herein in their entireties. In FIG. 6 a vertically opposed SCARA arm configuration is illustrated (the forearm and end effectors are not shown as dashed blocks 600, 601 for clarity) such as described in U.S. patent application Ser. No. 13/293,717 filed on Nov. 10, 2011 and Ser. No. 13/417,837 filed on Mar. 12, 2012 the disclosures of which are incorporated by reference herein in their entireties. Here each of the arms 2000, 2001 may be substantially similar to that described above with respect to FIG. 3 and includes a drive section 2000D, 2001D (each having e.g. two motors but in other aspects may include more or less than two motors) substantially similar to that described above with respect to any one or more of FIGS. 4A-5B. For example, in one aspect both drive sections 2000D, 2001D may have a common drive configuration (e.g. both drive sections are configured in the manner described above with respect to FIGS. 4A-4D or both drive sections are configured in the manner described above with respect to FIGS. 5A-5B). In another aspect the drive sections 2000D, 2001D may have different configurations (e.g. one drive section may be configured in the manner described above with respect to FIGS. 4A-4D while the other drive section is configured in the manner described above with respect to FIGS. 5A-5B).

Figure 7:
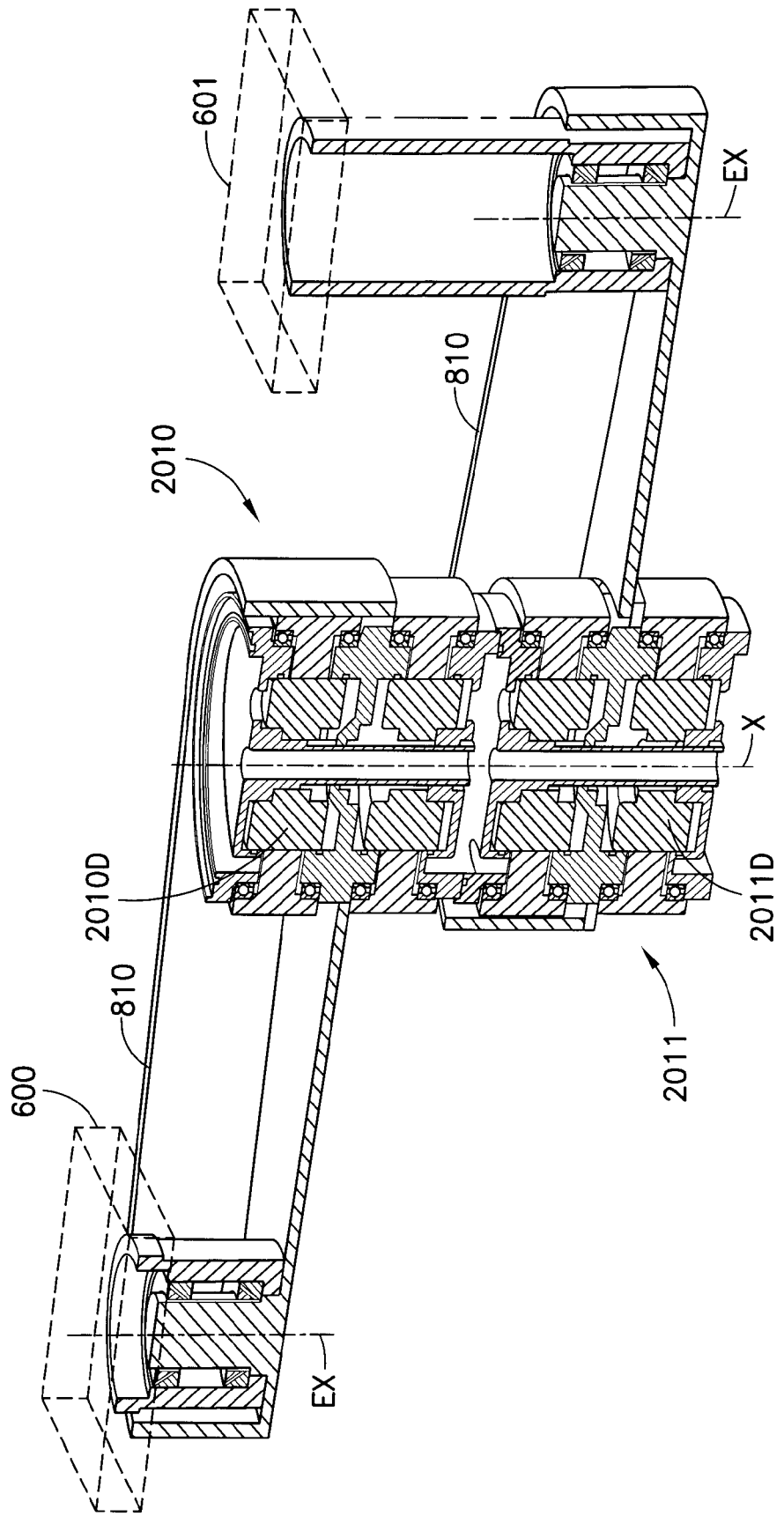
FIG. 7 is a schematic cross-sectional view of a portion of a transfer apparatus in accordance with aspects of the disclosed embodiment.

FIG. 7 illustrates another dual SCARA arm configuration where each arm 2010, 2011 (each of which may be substantially similar to that described above with respect to FIG. 3) includes a drive section 2010D, 2011D (each having e.g. two motors but in other aspects may include more or less than two motors) substantially similar to that described above with respect to any one or more of FIGS. 4A-5B. In this aspect the arms 2010, 2011 are configured such that the forearms and end effectors (illustrated by dashed boxes 600, 601 for clarity) of each arm 2010, 2011 are located on, e.g. a top of the upper arm but in other aspects the forearm and end effectors may be located on a bottom of the respective upper arms.

Figure 8:
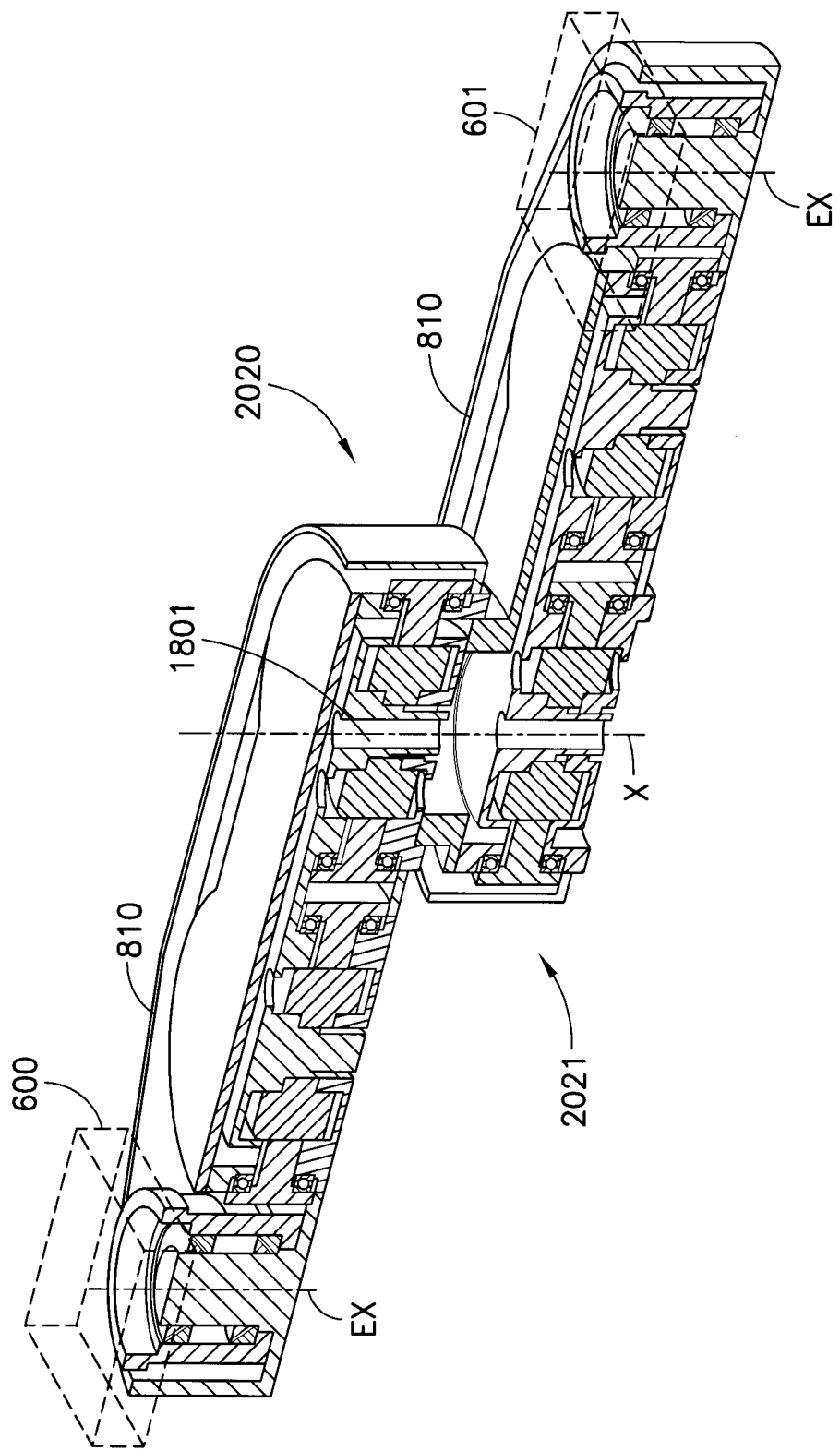
FIG. 8 is a schematic cross-sectional view of a portion of a transfer apparatus in accordance with aspects of the disclosed embodiment.
Figure 9:
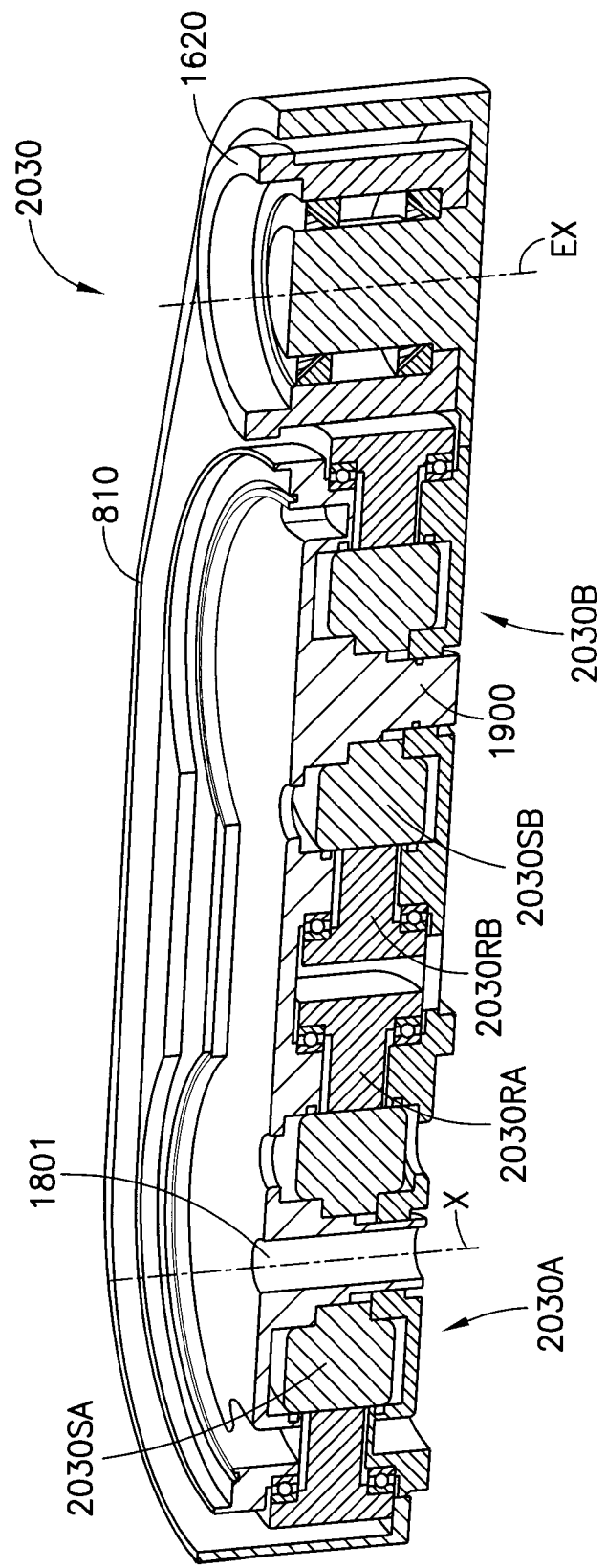
FIG. 9 is a schematic cross-sectional view of a portion of a transfer apparatus in accordance with aspects of the disclosed embodiment.

Referring to FIGS. 8 and 9 a portion of a transport robot arm having a dual arm configuration is shown in accordance with aspects of the disclosed embodiment. Each arm 2020, 2021 may be substantially similar to that described above with respect to FIG. 3 and includes two drive motors substantially similar to those described above except in this aspect the motors are not vertically stacked one above the other but rather are disposed in the same horizontal plane within a respective one of the arm links. FIG. 9 illustrates a single arm 2030 configuration substantially similar to that shown in FIG. 8; e.g. in FIG. 8 the two arms 2020, 2021 are each mounted to a common shaft 1801 so as to be rotatable about the shoulder axis X whereas in FIG. 9 only a single arm 2030 is mounted to the shaft 1801, otherwise the drive motor configuration for the arms 2020, 2021 and 2030 are substantially the same. For exemplary purposes, the drive motors of the arms 2020, 2021, 2030 will be described with respect to the arm 2030. In this aspect, each drive motor 2030A, 2030B include a stator 2030SA, 2030SB and a rotor 2030RA, 2030RB substantially similar to those described above. It is noted that in one aspect the drive motors 2030A, 2030B may be variable reluctance motors so that there are no magnets exposed to, for example, a vacuum environment in which the transport robot operates, otherwise any suitable seals may be provided to isolate the magnetic components of the rotors and/or stators in any suitable manner. The stator 2030SA for drive motor 2030A may be fixed to the shaft 1801 so that it remains rotationally stationary with respect to, for example, the upper arm 810. The rotor 2030RA may be mounted within and fixed to the upper arm 810 in any suitable manner so that the upper arm 810 and the rotor 2030RA rotate as a unit (e.g. when the stator 2030SA drives the rotor 2030RA for rotation about the shoulder axis X the upper arm 810 rotates with the rotor 2030RA). The stator 2030SB for drive motor 2030B may be fixedly mounted to a shaft 1900 disposed within the upper arm 810 so that the stator 2030SA is rotationally fixed with respect to the shaft 1900. The rotor 2030RB may be mounted in any suitable manner within the upper arm 810 so as to be rotatable about the stator 2030SB. The rotor 2030RB may include an integral pulley (or in other aspects the pulley may be attached to the rotor in any suitable manner) that connects the rotor 2030RB, through any suitable transmission to elbow pulley 1620 for drivingly rotating the forearm 820 (FIG. 3) in a manner substantially similar to that described above. For example, the elbow pulley may be fixedly attached to the forearm 820 in any suitable manner so that when the elbow pulley 1620 rotates the forearm 820 rotates with it. In other aspects, the rotor 2030RB may drive rotation of the elbow pulley 1620 in nay suitable manner. In still other aspects of the disclosed embodiments, any suitable robot arm configuration may be used. Suitable examples of robot arms with which the drive system of the exemplary embodiments may be employed can be found in U.S. patent application Ser. No. 13/270,844 filed on Oct. 11, 2011 and Ser. No. 13/270,844 filed on Oct. 11, 2011 the disclosures of which are incorporated by reference herein in their entireties.

In accordance with one or more aspects of the disclosed embodiment of the disclosed embodiments a substrate transport apparatus is provided. The substrate transport apparatus includes a frame, at least one arm link rotatably connected to the frame and a shaftless drive section. The shaftless drive section including stacked drive motors for rotating the at least one arm link relative to the frame through a shaftless interface, each of the stacked drive motors including a stator having stator coils disposed on a fixed post fixed relative to the frame and a rotor substantially peripherally surrounding the stator such that the rotor is connected to a respective one of the at least one arm links for rotating the one of the at least one arm link relative to the frame causing an extension or retraction of the one of the at least one arm link, where the stacked drive motors are disposed in the at least one arm link so that at least part of each stator is within a common arm link of the at least one arm link.

In accordance with one or more aspects of the disclosed embodiment, the shaftless drive section is disposed substantially within the at least one arm link.

In accordance with one or more aspects of the disclosed embodiment, the stator coil is isolated from vacuum.

In accordance with one or more aspects of the disclosed embodiment, the substrate transport apparatus further includes a second drive section disposed at least partially within the frame and configured to linearly move the at least one arm link in a direction substantially normal (e.g. vertical, Z-axis) to a plane containing a direction of extension or retraction of the at least one arm link. Further, the at least one arm link is connected to the frame by a seal capable of accommodating relative axial movement (e.g. vertical, Z-axis) between the at least one arm link and frame wherein the seal is located on one side of the arm and the first drive section is located on the opposite side of the arm.

In accordance with one or more aspects of the disclosed embodiment, the at least one arm link includes an upper arm rotatably connected to the frame about a shoulder axis of rotation, a forearm rotatably connected to the upper arm about an elbow axis of rotation and at least one substrate holder rotatably connected to the forearm about a wrist axis of rotation and the at least one drive motor includes at least two stacked drive motors where each motor drives rotation of a respective one of the upper arm and forearm.

In accordance with one or more aspects of the disclosed embodiment, the at least one arm link includes an upper arm rotatably connected to the frame about a shoulder axis of rotation, a forearm rotatably connected to the upper arm about an elbow axis of rotation and at least one substrate holder rotatably connected to the forearm about a wrist axis of rotation and the at least one drive motor includes at least three stacked drive motors where each motor drives rotation of a respective one of the upper arm, forearm and at least one substrate holder.

In accordance with one or more aspects of the disclosed embodiment, the at least one arm link includes an upper arm rotatably connected to the frame about a shoulder axis of rotation and at least one substrate holder movably mounted to the upper arm for linear travel along at least a portion of a length of the upper arm and the at least one drive motor includes at least two stacked drive motors where one of the at least two stacked drive motors drives rotation of the upper arm and the other ones of the at least two stacked drive motors drives the linear travel of a respective one of the at least one substrate holder.

In accordance with one or more aspects of the disclosed embodiment, the shaftless drive section includes seals for sealing the stator from an environment in which the at least one arm link operates. Further, each rotor includes magnets for interfacing with a respective stator wherein the drive section includes seals for sealing the magnets of the rotor from an environment in which the at least one arm link operates.

In accordance with one or more aspects of the disclosed embodiment, a height of the shaftless drive section is decoupled from a Z-travel of the substrate transport apparatus.

In accordance with one or more aspects of the disclosed embodiment a substrate transport apparatus is provided. The substrate transport apparatus includes a frame, at least one arm link rotatably connected to the frame and a shaftless distributed drive section disposed substantially within the at least one arm link. The shaftless distributed drive section including at least two drive motors where one of the at least two drive motors is connected to the at least one arm link for rotating the at least one arm link relative to the frame, and the at least two drive motors are arranged within the at least one arm link side by side along a common horizontal plane.

In accordance with one or more aspects of the disclosed embodiment, each of the at least two drive motors includes a stator and a rotor substantially peripherally surrounding the stator.

In accordance with one or more aspects of the disclosed embodiment, the substrate transport apparatus further includes a second drive section disposed at least partially within the frame and configured to linearly move the at least one arm link in a direction substantially perpendicular to a direction of extension or retraction of the at least one arm link.

In accordance with one or more aspects of the disclosed embodiment a substrate transport apparatus is provided. The substrate transport apparatus includes a frame, at least one arm rotatably connected to the frame and having at least an upper arm and forearm. The substrate transport apparatus also includes a shaftless drive section connected to the frame. The shaftless drive section including at least one drive motor including a stator having at least two nested stator coils, an inner rotor substantially peripherally surrounded by the stator and an outer rotor substantially peripherally surrounding the stator such that the inner rotor is connected to the forearm for rotating the forearm and the outer rotor is connected to the upper arm for rotating the upper arm.

In accordance with one or more aspects of the disclosed embodiment the substrate transport apparatus includes a second drive section disposed at least partially within the frame and configured to linearly move the at least one arm link in a direction substantially normal to a plane containing a direction of extension or retraction of the at least one arm link.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
   a frame;
   at least one arm link rotatably connected to the frame; and
   a shaftless drive section, the shaftless drive section including stacked drive motors for rotating the at least one arm link relative to the frame through a shaftless interface, wherein each of the stacked drive motors is a shaftless motor including a stator having stator coils disposed on a fixed post fixed relative to the frame and a rotor substantially peripherally surrounding the stator such that the rotor is connected to a respective one of the at least one arm link for rotating the respective one of the at least one arm link relative to the frame causing an extension or retraction of the at least one arm link, where the stacked drive motors are disposed in the at least one arm link so that at least part of each stator is within a common arm link of the at least one arm link.

2. The substrate transport apparatus of claim 1, wherein the shaftless drive section is disposed substantially within the at least one arm link.

3. The substrate transport apparatus of claim 1, wherein the stator coil is isolated from vacuum.

4. The substrate transport apparatus of claim 1, further comprising:
a second drive section disposed at least partially within the frame and configured to linearly move the at least one arm link in a direction substantially normal to a plane containing a direction of extension or retraction of the at least one arm link.

5. The substrate transport apparatus of claim 4, wherein the at least one arm link is connected to the frame by a seal capable of accommodating relative axial movement between the at least one arm link and frame wherein the seal is located on one side of the arm and the first drive section is located on the opposite side of the arm.

6. The substrate transport apparatus of claim 1, wherein the at least one arm link includes an upper arm rotatably connected to the frame about a shoulder axis of rotation, a forearm rotatably connected to the upper arm about an elbow axis of rotation and at least one substrate holder rotatably connected to the forearm about a wrist axis of rotation and the at least one drive motor includes at least two stacked drive motors where each motor drives rotation of a respective one of the upper arm and forearm.

7. The substrate transport apparatus of claim 1, wherein the at least one arm link includes an upper arm rotatably connected to the frame about a shoulder axis of rotation, a forearm rotatably connected to the upper arm about an elbow axis of rotation and at least one substrate holder rotatably connected to the forearm about a wrist axis of rotation and the at least one drive motor includes at least three stacked drive motors where each motor drives rotation of a respective one of the upper arm, forearm and at least one substrate holder.

8. The substrate transport apparatus of claim 1, wherein the at least one arm link includes an upper arm rotatably connected to the frame about a shoulder axis of rotation and at least one substrate holder movably mounted to the upper arm for linear travel along at least a portion of a length of the upper arm and the at least one drive motor includes at least two stacked drive motors where one of the at least two stacked drive motors drives rotation of the upper arm and the other ones of the at least two stacked drive motors drives the linear travel of a respective one of the at least one substrate holder.

9. The substrate transport apparatus of claim 1, wherein the shaftless drive section includes seals for sealing the stator from an environment in which the at least one arm link operates.

10. The substrate transport apparatus of claim 9, wherein each rotor includes magnets for interfacing with a respective stator wherein the drive section includes seals for sealing the magnets of the rotor from an environment in which the at least one arm link operates.

11. The substrate transport apparatus of claim 1, wherein a height of the shaftless drive section is decoupled from a Z-travel of the substrate transport apparatus.

12. The substrate transport apparatus of claim 1, further comprising an encoder interfacing with each of the stacked drive motors, the encoder including a sensor system and at least one scale, the sensor system being mounted to the fixed post and the scale being integrated into the rotor of a respective one of the stacked drive motors such that an interface plane between the sensor system and scale is arranged at an angle relative to an interface plane between the stator and the rotor of the respective one of the stacked drive motors.

13. A substrate transport apparatus comprising:
a frame;
at least one arm link rotatably connected to the frame; and
a shaftless distributed drive section disposed substantially within the at least one arm link, the shaftless distributed drive section including at least two drive motors where one of the at least two drive motors is connected to the at least one arm link for rotating the at least one arm link relative to the frame, and the at least two drive motors are shaftless motors arranged within the at least one arm link side by side along a common horizontal plane.

14. The substrate transport apparatus of claim 13, wherein each of the at least two drive motors includes a stator and a rotor substantially peripherally surrounding the stator.

15. The substrate transport apparatus of claim 13, further comprising:
a second drive section disposed at least partially within the frame and configured to linearly move the at least one arm link in a direction substantially perpendicular to a direction of extension or retraction of the at least one arm link.

16. A substrate transport apparatus comprising:
a frame;
at least one arm rotatably connected to the frame and having at least an upper arm and a forearm; and
a shaftless drive section connected to the frame, the shaftless drive section including at least one drive motor, wherein the at least one drive motor is a shaftless motor including a stator having at least two nested stator coils, an inner rotor substantially peripherally surrounded by the stator and an outer rotor substantially peripherally surrounding the stator such that the inner rotor is connected to the forearm for rotating the forearm and the outer rotor is connected to the upper arm for rotating the upper arm.

17. The substrate transport apparatus of claim 16, further comprising:
a second drive section disposed at least partially within the frame and configured to linearly move the at least one arm link in a direction substantially normal to a plane containing a direction of extension or retraction of the at least one arm link.

* * * * *